United States Patent [19]
Yagi et al.

[11] Patent Number: 6,020,215
[45] Date of Patent: Feb. 1, 2000

[54] PROCESS FOR MANUFACTURING MICROSTRUCTURE

[75] Inventors: Takayuki Yagi, Yokohama; Masatake Akaike, Atsugi, both of Japan

[73] Assignee: Canon Kabushiki Kaisha, Tokyo, Japan

[21] Appl. No.: 08/844,971

[22] Filed: Apr. 28, 1997

Related U.S. Application Data

[62] Division of application No. 08/378,610, Jan. 26, 1995, Pat. No. 5,658,698.

[30] Foreign Application Priority Data

| Jan. 31, 1994 | [JP] | Japan | 6-009004 |
| Jun. 8, 1994 | [JP] | Japan | 6-125967 |
| Sep. 9, 1994 | [JP] | Japan | 6-215861 |

[51] Int. Cl.⁷ .............................. H01L 21/311
[52] U.S. Cl. .................. 438/52; 438/459; 216/11
[58] Field of Search ............. 438/52, 53, 455, 438/619, 951, FOR 105, FOR 220, FOR 432, FOR 438, 459; 148/DIG. 12; 216/11

[56] References Cited

U.S. PATENT DOCUMENTS

| 5,595,942 | 1/1997 | Albrecht et al. . |
| 5,665,250 | 9/1997 | Iwata et al. . |
| 5,753,134 | 5/1998 | Biebl . |
| 5,789,264 | 4/1998 | Chung . |
| 5,844,287 | 12/1998 | Hassan et al. . |

FOREIGN PATENT DOCUMENTS

| 1-166541 | 6/1989 | Japan . |
| 1-181447 | 7/1989 | Japan . |
| 2-251142 | 10/1990 | Japan . |

*Primary Examiner*—George Fourson
*Attorney, Agent, or Firm*—Fitxpatrick, Cella, Harper & Scinto

[57] ABSTRACT

A microstructure comprising a substrate (1), a patterned structure (beam member) (2) suspended over the substrate (1) with an air-space (4) therebetween and supporting structure (3) for suspending the patterned structure (2) over the substrate (1). The microstructure is prepared by using a sacrificial layer (7) which is removed to form the space between the substrate (1) and the patterned structure (2) adhered to the sacrificial layer. In the case of using resin as the material of the sacrificial layer, the sacrificial layer can be removed without causing sticking, and an electrode can be provided on the patterned structure. The microstructure can have application as electrostatic actuator, etc., depending on choice of shape and composition.

25 Claims, 16 Drawing Sheets

PROCESS FOR MANUFACTURING MICROSTRUCTURE

This application is a division of application Ser. No. 08/378,610 filed Jan. 26, 1995, now U.S. Pat. No. 5,658,698.

BACKGROUND OF THE INVENTION

1. Field of the Invention

The present invention relates to a micro-structure which can be produced by micromechanical processing.

2. Related Art

In recent years, micro-machines having small movable parts have been investigated. In particular, in the case of making microstructures by using technologies for semiconductor integrated circuits, such as those which include photolithographic processing, micro-parts can be reproduced accurately. Thereby, the parts can be arrayed easily on a substrate and the parts can be produced at low cost. The parts can respond quicker than parts produced by prior techniques because of their reduced size.

Three typical methods of producing a micro-structure on a substrate are described below.

One is a process for producing a micro-motor (M. Mehregany et al., "Operation of Micro Fabricated Harmonic and Ordinary Side-Drive Motors"—Proceedings IEEE Micro Electro-Mechanical Systems Workshop 1990, pp. 1–8) or a linear microactuator (P. Chenung et al, "Modelling and Position-Detection of a Polysilicon Linear Micro Actuator", Micro Mechanical Sensors, Actuators and Systems ASME 1991, DS C-Vol.32, pp. 269–278).

This first process comprises: forming a silicon dioxide layer and a polysilicon layer on a silicon substrate in that order, or providing a SOI (silicon on insulator) substrate;

patterning the silicon layer or the polysilicon layer to form a patterned structure; and removing the silicon dioxide layer by an aqueous solution of hydrogen fluoride to produce the microstructure. The silicon dioxide layer is used, therefore, as a sacrificial layer. (See "SOI (SIMOX) as a Substrate for Surface Micromachining of Single Crystalline Silicon Sensors and Actuators". The 7th International Conference on Solid State Sensors and Actuators, Transducers 93, Jun. 7–10, 1993, pp. 233–236).

According to this first process, however, it is necessary to use materials for the micro-structure which are not eroded by hydrogen fluoride, and it is not possible to incorporate an electrode of erodable material, such as an aluminium electrode, in the micro-structure.

Furthermore, if polysilicon is adopted as the microstructure material, it is necessary to regulate the internal stress of polysilicon film in order to prevent bending of the substrate.

Furthermore, in the case of using an SOI substrate, buried silicon dioxide is removed. If the removal of this oxide is not carefully controlled, over-etching will occur. It is difficult therefore to maintain contact between the microstructure and the substrate. Also, if aluminum or other metal is deposited after removal of the buried silicon oxide, it is not easy to form a continuous electrode structure due to overhang of the microstructure.

The second process is a process for producing a spatial light modulator device provided with an aluminum micromirror. This is described in Japanese Patent Laid-Open Application No. 2-8812. This process comprises coating a photo-resist sacrificial layer on a substrate, then forming an aluminium layer on this sacrificial layer, patterning the aluminum layer, and removing the sacrificial layer by oxygen plasma etching to produce an aluminum film microstructure.

The micro-structure can be produced on various kinds of substrate and does not depend on the surface roughness of the substrate.

In addition, since the sacrificial layer is removed by dry etching, here a oxygen plasma etching process, sticking between the substrate and the micro-structure, which can happen when removing the sacrificial layer by a wet etching process, is avoided. However, since it is necessary to deposit the film for the micro-structure at a low temperature to avoid damage to the sacrificial layer, the choice of microstructure material is severely restricted. Furthermore, it is necessary to regulate the internal stress of the film for the microstructure to prevent the microstructure from bending.

The third process is a process in which the pattern for the microstructure is formed on a Si substrate, after which a part of the pattern is bonded anodically to a glass substrate, after which the bonded Si substrate is etched from its back surface until the pattern is left on the glass substrate.

A linear actuator comprising bulk Si film (Y. Gianchandani et al., "Micron-Sized, High Aspect Ratio Bulk Silicon Micromechanical Systems Devices", Proceedings IEEE Electro Mechanical Workshop 1992, pages 208–213), or a cantilever comprising silicon nitride for an Atomic Force Microscope (AFM) may be produced by this process (U.S. Pat. No. 5,221,415).

In this process, it is not necessary to use a sacrificial layer so that micro-structures made of a material which does not have resistance to hydrogen fluoride can be produced.

However, the microstructure materials are limited to those which can be bonded anodically to glass, such as Si, Al, Ti, Ni, which are electroconductive and which can be oxidised, or silicon dioxide film or silicon nitride film coated on a substrate.

Furthermore, when bonding is made anodically a temperature of 300° C. or more is usual and it is necessary therefore to use a glass having the same thermal expansion coefficient as that of the Si substrate to avoid damage to the substrate by heat stress. The choice of glass is limited to Pyrex glass (trade name #7740; manufactured by Corning) or the like.

Where an electrode is already provided on the substrate, it is then difficult to produce an electrode on the microstructure.

In addition, it is necessary to use a glass which contains mobile ions as the material of the substrate, such as soda glass, Pyrex and crystallised glass. Consequently, this process is inapplicable to substrates incorporating integrated circuit components.

Furthermore, in the case of bonding the electroconductive material to the glass anodically, it is necessary for the glass and the electro-conductive material to have a surface roughness of 50 nm or less.

In U.S. Pat. No. 5,221,415, silicon nitride is bonded anodically to glass at 475° C. Consequently, electrodes have to be formed by vacuum evaporation on the whole surface of the substrate after producing the microstructure. It is difficult, however, to form a patterned electrode on a beam structure such as a cantilever.

SUMMARY OF THE INVENTION

The present invention is intended as a solution to the problems aforesaid.

According to a first aspect of the present invention, there is provided a microstructure comprising a substrate and a beam member separated from said substrate by an air space, having supporting means arranged to suspend said beam member over said substrate, which supporting means is attached to that surface of said beam member which is further from said substrate.

According to another aspect of the present invention, there is provided a process for producing a microstructure comprising the steps of:

(a) providing a first substrate having a first sacrificial layer over its surface and a beam member on said first sacrificial layer;

(b) forming supporting means over said beam member with the inside surface of said supporting means attached to that surface of said beam member which is further from said first substrate; and (c) removing said first sacrificial layer to form an airspace between said beam member and said first substrate.

Other aspects of the invention will be apparent from the description given below and from the appended claims.

DETAILED DESCRIPTION OF THE PREFERRED EMBODIMENTS

The present invention will be explained with reference to the drawings. The following description is given by way of example only.

Figure 1:
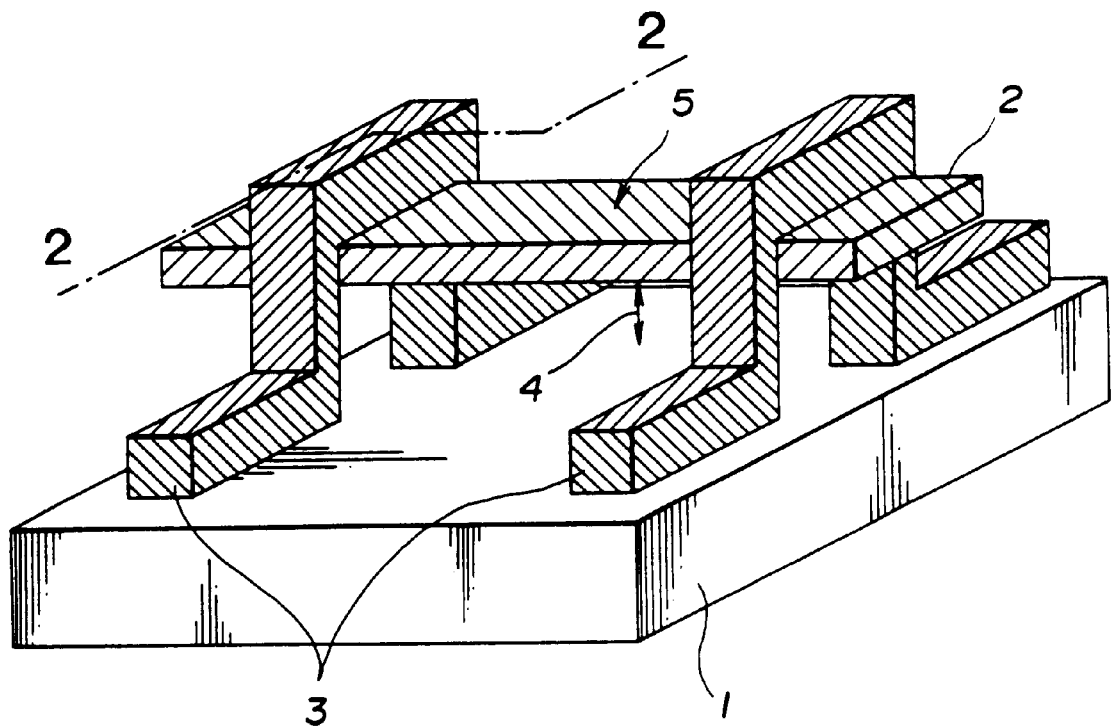
FIG. 1 is a schematic view of a first microstructure embodying the present invention.

FIG. 1 is a schematic view of a first microstructure embodying the present invention, and FIGS. 2(A)–(K) are views illustrating stages in a process of producing the microstructure of FIG. 1.

Referring to FIG. 1, 1 is a first substrate, 2 is a beam member and 3 is a supporting structure. The member 2 is suspended above the first substrate 1, over an airspace 4, by the supporting structure 3, and the beam 2 is attached to the supporting structure 3 at its surface 5 which is further from the substrate 1.

A process for producing the microstructure shown in FIG. 1 will now be explained with reference to FIG. 2.

Figure 2A:
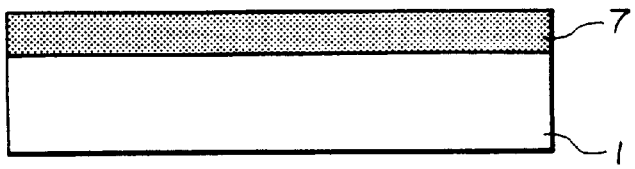
FIGS. 2(A)–2(K) are sectional views for illustrating a first process for producing the microstructure of FIG. 1, taken on line 2—2 of FIG. 1.

First, the first substrate 1 and a second substrate 6 are provided, and then a first sacrificial layer 7 is formed on the first substrate 1 (FIG. 2(A)).

Figure 2B:
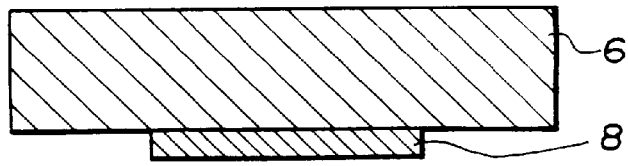

Photo-resist is coated on the second substrate 6 to form a photoresist layer, after which the photo-resist layer is exposed to radiation and is developed to form a patterned photo-resist layer 8 (FIG. 2(B)).

Figure 2C:
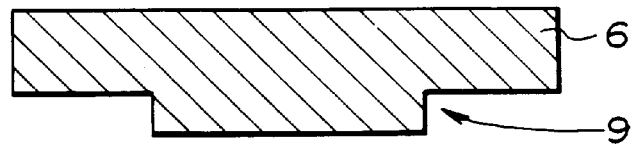

The second substrate 6 is then etched using the patterned photo-resist layer as a mask to produce a patterned prominence 9 which is to form the beam member 2 (FIG. 2(C)).

Figure 2D:
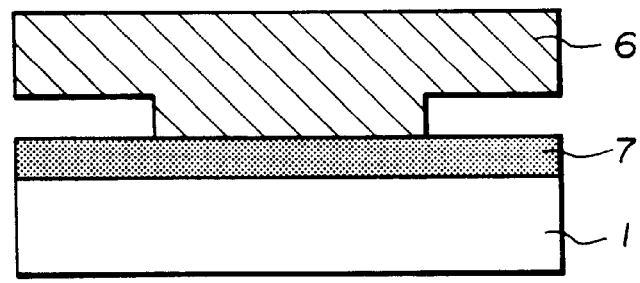

The first substrate 1 having the first sacrificial layer 7 is then adhered to the second substrate 6 with the patterned prominence 9 in contact with the first sacrificial layer 7 (FIG. 2(D)).

Figure 2E:
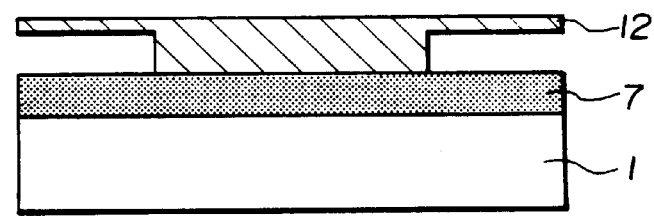
Figure 2F:
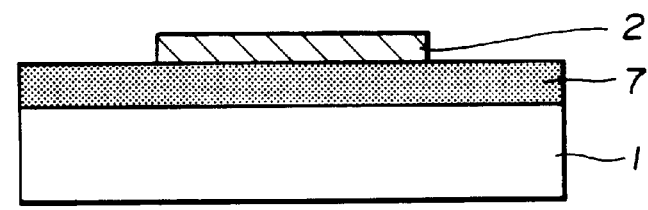
Figure 2G:
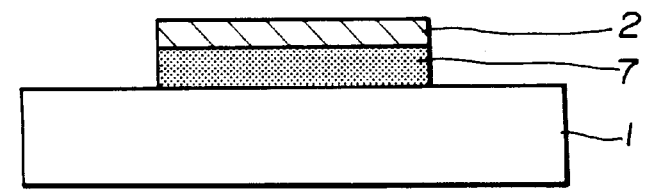

The second substrate 6 is then etched down to the patterned prominence 9 to produce the beam-shaped member 2 (FIGS. 2(E), (F)), after which the first sacrificial layer 7 is etched using the member 2 as a mask (FIG. 2(G)).

Figure 2H:
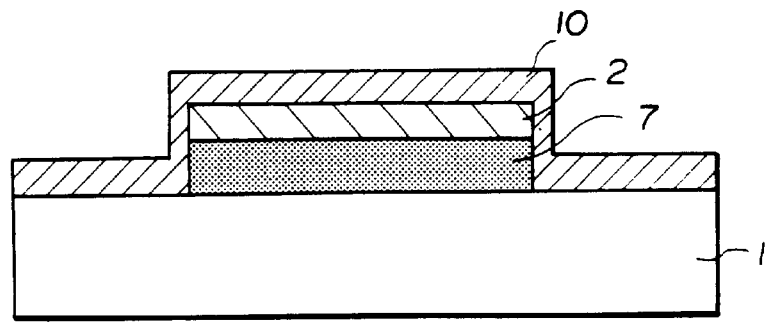

Next, a layer 10 for the supporting structure 3 is formed on the member 2 and on the exposed adjacent surfaces of the first sacrificial layer 7 and the first substrate 1 (FIG. 2(H)).

Figure 2I:
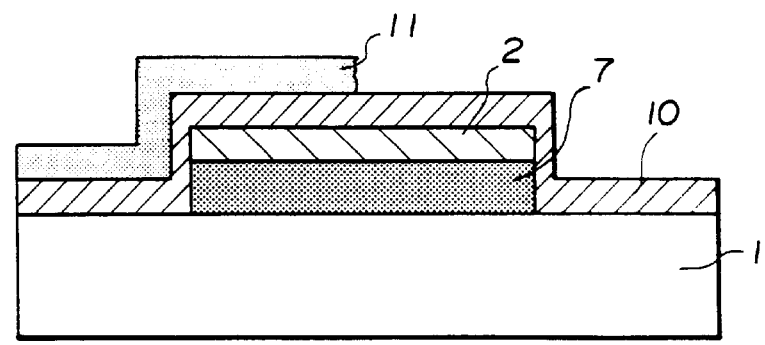
Figure 2J:
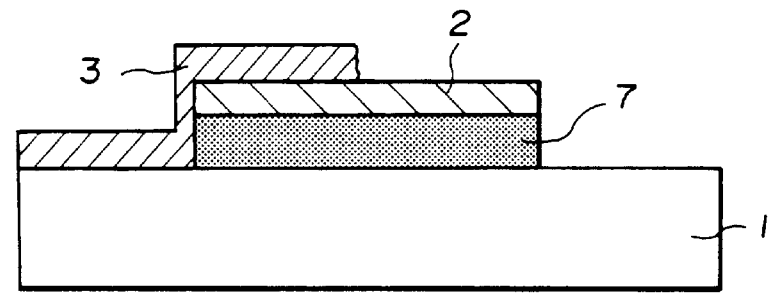
Figure 2K:
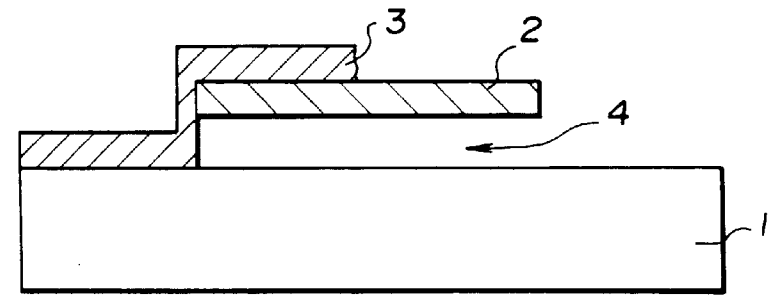

Next, a patterned photo-resist layer 11, whose pattern corresponds to the pattern of the supporting structure 3, is formed on the layer 10 (FIG. 2(I)) and the layer 10 is etched using the patterned photo-resist layer 11 as a mask to form the supporting structure 3 (FIG. 2(J)). The first sacrificial layer 7 is then removed to complete the manufacture of the microstructure shown in FIG. 1.

In the process shown in FIG. 2, the first sacrificial layer 7 acts as an adhesive layer, and for this purpose may comprise resin. The first sacrificial layer can be formed by usual methods, such as by applying a coating solution in which resin is dissolved in an organic solvent, by spin coating, spray coating, dip coating, etc., or by forming a film by the Langmuir-Blodgett method. A resin film having a flat surface can be obtained by these methods, even if the substrate has a rough surface, and therefore in the step for adhering the first substrate to the second substrate, face-adhering can be effected without depending on surface roughness of the substrate.

Preferred resin materials include photo-resists. These should not contain impurities, such as sodium ions, if the first substrate is a silicon substrate including integrated circuit components. In particular, such photo-resists containing a rubber having both good adhesive strength and good mechanical strength are preferably used. As the rubber, cyclized rubbers such as disclosed in "Bisaikako & Rejisuto (Fine Processing and Resist)" written by Saburo Nonogaki, edited by Kobunsi Gakkai (Society of Polymer), published by Kyoritsu Shuppan, 1991, pages 11–12 are preferably used, and as the photoresists containing rubber, OMR-83 (manufactured by Tokyo Oka Kogyo K.K.) is preferably used.

In the case of using the Langmuir-Blodgett method for forming the first sacrificial layer 7, a monomolecular laminated film, that is a Langmuir-Blodgett (LB) film consisting of molecules with a hydrophobic group and a hydrophilic group, is laminated on the first substrate 1, at least one layer or more, to form the sacrificial layer 7. In a multilayer film, the hydrophobic groups of each monomolecular film are adjacent and the hydrophilic group of each mono-molecular film are adjacent.

According to this method, the thickness of the sacrificial layer 7 can be regulated to nanometer precision, thus the air space 4 between the beam member 2 and the first substrate 1 can be regulated to the same nanometer precision.

As the step for adhering the first substrate 1 and the second substrate 6, the process as described below is preferred, that is, pressing together the first substrate 1 with the sacrificial layer 7 and the second substrate 6, and then heating the sacrificial layer 7 to evaporate solvent in the sacrificial layer 7 to cure the resin therein and to increase adhesive strength. In addition, at least one of the first substrate 1 and the second substrate 6 may be provided with a groove to allow solvent vapour to escape via the groove. Where the first substrate 1 and the second substrate 6 are conductive, it is possible to adhere the first and second substrates 1, 6 while applying voltage between these substrates 1, 6 to generate an electrostatic field.

In case of adhering the first and the second substrates 1, 6 by an LB film, the substrates 1, 6 can be adhered by the process as described below, that is a LB film formed on the first substrate 1 (or the second substrate 6) is brought into contact with the surface of the second substrate 6 (or the first substrate 1), and then a voltage is applied between the substrates 1, 6 to generate an electrostatic field to adhere them to each other.

Further, in a case of forming LB films on both the first and the second substrates 1, 6, the LB films preferably are formed so that the hydrophilic group of one LB film comes into contact with the hydrophilic group of the other LB film, or the hydrophobic group of one LB film comes into contact with the hydrophobic group of the other LB film.

Furthermore, in the case of forming the LB film on only one of the first and second substrates 1, 6, when the surface of the LB film is hydrophilic, the surface of the substrate is chosen to be hydrophilic, and when the surface of the LB film is hydrophobic, the surface of the substrate is chosen to be hydrophobic. Provided that the temperature of the LB film is maintained below its decomposition temperature, and a voltage is applied between the first and the second substrates 1, 6 the substrates 1, 6 can be adhered firmly.

In the process described above, the first substrate 1 can be adhered to a patterned prominence for the microstructure by a LB film. In case of using a resin layer for the sacrificial layer 7 as an adhesive layer, the resin layer can be cured at a relatively low temperature so that damage to the substrate 1 due to difference of thermal expansion coefficients between the first and second substrates 1, 6 can be avoided. Thus, the choice of materials for the substrates 1, 6 is not restricted in relation to thermal expansion coefficients.

In the steps for making the patterned thin film structure, such as the beam-shaped member 2 in FIG. 1, on the first substrate 1, a second substrate 6 or a second substrate 6 having a layer for the structure also may be processed.

Examples of the second substrate 6 having a layer for the structure may include a substrate 6 on which this layer is formed directly or a substrate 6 on which the layer is formed over said sacrificial layer for releasing the substrate 6 from the layer.

In a case of forming the patterned thin film layer from the second substrate 6, first of all, the second substrate 6 is processed by a suitable method, such as by photolithography, to form a patterned structure, after which the second substrate 6 is attached to the first substrate 1 by the first sacrificial layer 7 with the patterned surface of the second substrate 6 facing the first substrate 1. The second substrate 6 is then etched down to the patterned prominence 9 from the opposite surface to the patterned prominence 9 (i.e. the back surface) by wet etching with a suitable etchant for the second substrate 6, or by dry etching with a reactive gas, or the back surface of the second substrate 6 is abraded and lapped to form the patterned thin film structure 2.

In a case of using a silicon substrate as the second substrate 6, examples of etchants for wet etching include alkali aqueous solutions, such as a solution of potassium hydroxide (KOH), a solution of tetramethyl-ammonium hydroxide (TMAH), etc., or mixed aqueous solutions of hydrogen fluoride and nitric acid, and examples of reactive gases for dry etching include plasma gases of $CF_4$, $SF_6$, $NF_3$, etc.

When a substrate made of monocrystalline Si, GaAs, etc., is used as the second substrate 6, the microstructure obtained is not warped.

In the case of forming the patterned thin film layer 2 from the second substrate 6 having a layer for the structure 2, examples of the second substrates 6 include a laminated substrate which a glass substrate is bonded anodically to a metal layer as the second sacrificial layer formed on the layer for the structure, a substrate having an internal layer, such as SOI substrate which has silicon oxide film as the second sacrificial layer and silicon layer as the layer for the structure, SIMOX substrate, etc., a substrate on which the second sacrificial layer and the layer for the structure is formed directly.

Examples for the material of the second sacrificial layer are selected from materials which are eroded by an etchant which does not erode the layer for the structure 2.

The second sacrificial layer and/or the layer for the structure may be produced by a film forming method, such as vacuum evaporation, liquid coating and chemical vapour deposition and so on.

In the case of using anodic bonding for bonding the glass substrate and the metal film as the second sacrificial layer, the glass substrate preferably may contain mobile ions of alkali metal, such as sodium ions, lithium ions, etc. The metal film preferably may be of metal which can be bonded anodically, such as Al, Ti, Ni and so on, or of an alloy which contains a combination of these metals. Anodic bonding, such as may be used herein, is described, for example in U.S. Pat. No. 3,397,278.

When the metal film as above is formed on the layer for the structure, the layer used may be chosen from various materials, such as insulator, semiconductor, or metal material.

In the case of using the second substrate having a layer for the structure, it is necessary to remove the second substrate from the layer for the structure.

The second substrate can be removed from the layer by wet etching using an etchant suitable for the material of the second substrate, dry etching by a reactive gas, or abrasion.

In the case of using a second substrate having a second sacrificial layer, the second substrate can be removed from the layer by removing the second sacrificial layer to transfer the layer for the structure on the first sacrificial layer which had been formed on the first substrate.

The first sacrificial layer may comprise one layer or two or more layers, and in case of forming the first sacrificial layer comprising two or more layers, each layer may be cured before forming the other layer on the layer to avoid dissolution of the layer.

The curing can be practised by use of usual methods, such as baking, irradiation and so on.

In the case of using photoresist for the first sacrificial layer, the curing temperature may be the temperature at which the resin in the photoresist becomes crosslinked and insoluble to developer.

When negative type photoresist is used as the photoresist, the part which is irradiated is cured. In this curing step organic solvent vapour is evaporated from the photoresist so that it is preferable to provide a groove on the first substrate and/or second substrate to allow the vapour to escape, as described above.

The supporting structure 3 connects the first substrate and the layer for the structure, and is formed before removing the first sacrificial layer to provide support for the layer at the upper surface of the layer.

In addition, in case of using aluminium for the supporting structure, the layer can be connected with the first substrate electrically.

The first sacrificial layer can be removed by usual methods, such as immersion in a solvent for dissolving resin, dry etching by ashing with oxygen plasma, etc. Further, in a case of using an LB film as the first sacrificial layer, the first sacrificial layer can be removed by heating to decompose the LB film. Examples of heating the LB film may include irradiating by laser beam, such as from a $CO_2$ laser.

When resin is used for the first sacrificial layer, it is possible to remove the first sacrificial layer by dry etching so that sticking, which can happen when the first sacrificial layer is removed by wet etching, can be avoided.

As described above, in the process for producing the microstructure the choices of the first substrate material, the second substrate material and the material for the layer for the structure are not restricted. In addition, in the process for removing the first sacrificial layer, electrodes can be provided on the structure. Provided the first sacrificial layer is removed by using solvent, by ashing, by heating etc., electrodes are not etched.

Furthermore, sticking can be avoided by removing the first sacrificial layer and the second sacrificial layer by dry etching process or heating.

Examples of the microstructure may include: cantilevers for microscopes which detect tunnelling electric current, Van der Waals' force, magnetic force or electrostatic force, etc., such as atomic force microscopes (AFM); scanning tunnelling microscopes (STM); and electric circuits having air bridge structure, etc.

In particular, an electrostatic actuator comprising a substrate, fixed electrode and first plate electrode which are formed on the substrate, a beam provided on the first plate electrode over an air space by a supporting structure comprising a metal film and a second plate electrode formed on the beam, wherein the electrode is connected electrically with the fixed electrode by the supporting structure, and the beam is supported by the supporting structure at the upper surface of the beam, and the beam is movable by applying voltage between the first plate electrode and the movable electrode can be obtained.

A number of embodiments of the present invention will now be explained in more detail with reference to the following examples.

EXAMPLE 1

A microstructure shown in FIG. 1 was prepared according to a process as shown in FIG. 2.

First of all, a monocrystalline silicon substrate was provided as a second substrate 6.

A layer of photoresist was coated on this silicon substrate 6. The photoresist layer was then exposed and developed to produce the patterned photoresist layer 8 whose pattern corresponds to the pattern of the beam-shaped member 2.

Next, the silicon substrate 6 was etched by reactive ion etching with a mixture of $SF_6$ and $CCl_2F_2$ using the patterned photoresist layer 8 as a mask to produce a beam patterned prominence 9. The patterned photoresist layer 8 was then removed (FIG. 2(C)).

The height of the beam patterned prominence 9 was 5 $\mu$m.

Meanwhile, a glass substrate (trade name: #7059; manufactured by Corning) was provided as the first substrate 1.

Polymethylmethacrylate (PMMA) was dissolved in methylethylketone (MEK) to make a PMMA solution, after which the PMMA solution was coated on the glass substrate 1 by spin coating to form the first sacrificial layer 7 of PMMA film. The thermal expansion coefficient of the glass substrate 1 was 1.4 times that of the silicon substrate 6.

Next, the second substrate 6 shown in FIG. 2(C) was adhered to the surface of the first substrate 1 by the first sacrificial layer 7 by applying pressure to the back surface of each substrate 1, 6.

Pressure was applied to ensure that the beam patterned prominence 9 was adhered adequately to the first sacrificial layer 7.

The first sacrificial layer 7 was then cured by heating at 150° C. and the thickness of the cured first sacrificial layer 7 was 2 $\mu$m.

The silicon substrate 6 was then etched with a 30 wt % KOH aqueous solution heated at 100° C. to form a thin silicon membrane 12 as shown in FIG. 2(E), after which the silicon thin film was removed by reactive ion etching with $SF_6$ gas to produce the beam-shaped member 2 having 1 $\mu$m of thickness (FIG. 2(F)). The first sacrificial layer 7 was then etched by reactive ion etching with oxygen using the beam-shaped member 2 as a mask (FIG. 2(G)).

Next, an aluminum layer 10 was formed on the exposed surfaces of the first substrate 1, first sacrificial layer 7 and member 2 by sputtering. The thickness of the aluminum layer 10 was 1 $\mu$m. Then a patterned photoresist layer 11 was formed on the aluminum layer 10 (FIG. 2(I)). The aluminum layer 10 was then etched by an etchant comprising acetic acid, phosphoric acid and nitric acid to produce the supporting structure 3 (FIG. 2(J)).

Finally, the first sacrificial layer 7 was removed by immersing the first substrate 1 into an organic solvent for removing PMMA (trade name: OMR Remover, manufactured by Tokyo Ouka Kogyo K.K.) to complete the microstructure comprising a 1 $\mu$m thickness silicon beam 2 supported by aluminum supporting structure 3, and having a 2 $\mu$m air space 4 between the beam 2 and the first substrate 1.

Since an organic solvent was used to remove the first sacrificial layer 7, the supporting structure 3 was not etched.

According to Example 1, the bridge member 2 was provided by a part 9 of the second substrate 6 made of crystalline silicon as shown in FIG. 2(B). A patterned beam member which does not have internal stress therefore can be prepared easily.

In addition, the second substrate 6 was grooved so that vapour evaporated in the step of curing the first sacrificial layer 7 could escape. If a groove is not provided, bubbles can be trapped between the first sacrificial layer 7 and the second substrate 6. When a groove is provided, bubbles can be avoided.

When a resin layer is used for the first sacrificial layer 7, the material of the first substrate 1 can be selected from materials whose thermal expansion coefficients are different from that of the second substrate 6.

Furthermore, in this example, the first sacrificial layer 7 serves not only as a spacer but also as an adhesive layer.

In this example, aluminum is used for the supporting structure 3 but insulator material, such as silicon dioxide, etc., could be used instead to produce an insulated microstructure.

EXAMPLE 2

Figure 3:
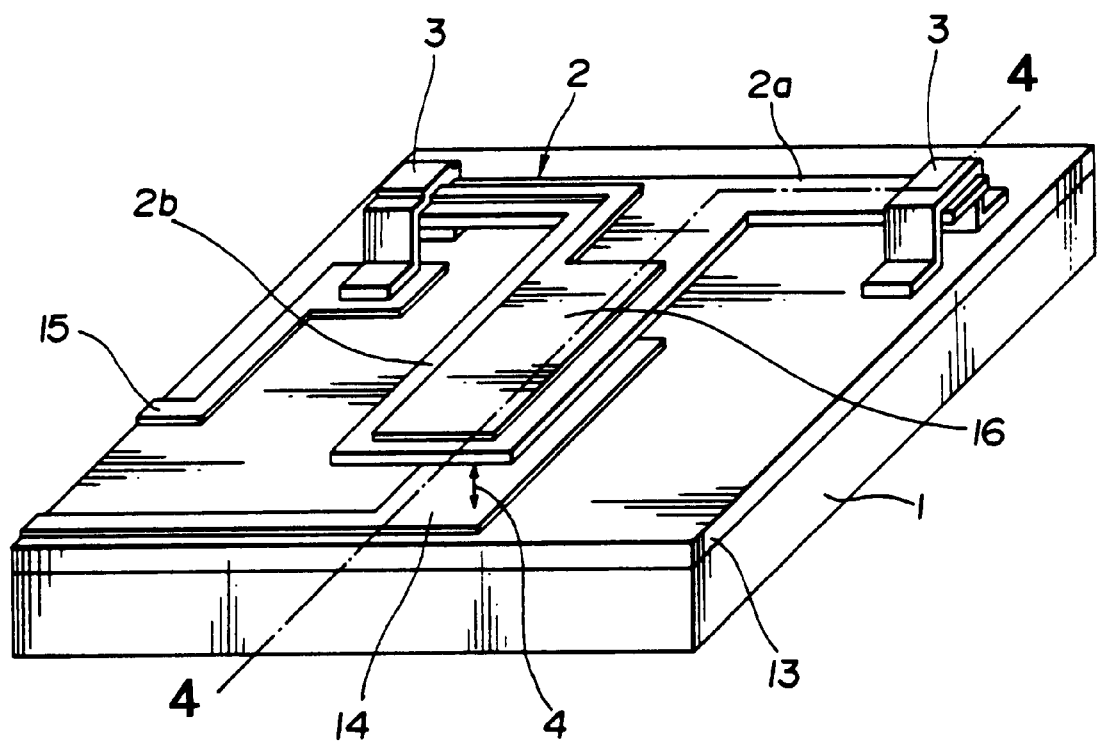
FIG. 3 is a schematic view of an electrostatic actuator as a second embodiment of the present invention.

A microstructure shown in FIG. 3 was prepared according to the process as shown in FIG. 4.

Referring to FIG. 3: 1 is a silicon substrate; 13 is an insulating layer of silicon dioxide; 14 is a first-plate electrode formed on the insulating layer 13; 15 is a fixed electrode formed on the insulating layer 13; and 2 is a beam member having a torsion bar portion 2a and a cantilever portion 2b, and is suspended by a supporting structure 3 attached to the upper surface of the torsion bar portion 2a of the beam member 2. The beam member 2 is provided with a second plate electrode 16 and is spaced above the insulating layer 13 by an air space 4. (Hereinafter this structure is called an "air bridge structure".)

The supporting structure 3 is of an electrically conductive material, and the second plate electrode 16 is connected to the fixed electrode 15 electrically by the supporting structure 3.

When a voltage is applied between the first plate electrode 14 and the fixed electrode 15 which is connected to the second plate electrode 16, the torsion bar portion 2a of the beam member 2 is twisted torsionally and the cantilever portion 2b of the beam member 2 is displaced. Thus, the microstructure of this example can be used as an electrostatic actuator.

Next, a process for preparing the microstructure as shown in FIG. 3 will be explained with reference to FIG. 4.

First of all, a silicon substrate was provided as the second substrate 6. Next, a 1 $\mu$m thick silicon nitride layer 17 was formed on the silicon substrate 6 by Low Pressure Chemical Vapour Deposition (LP-CVD) using a gas mixture of dichlorosilane ($SiH_2Cl_2$) and ammonia ($NH_3$) at 850° C. (FIG. 4(A)).

A rubber type photoresist (trade name: OMR-83: manufactured by Tokyo Ouka Kyogo K.K.) was coated on the silicon nitride layer 17 by spin coating to form a first photoresist layer 7a (FIG. 4(B)).

Also, a silicon substrate 1 provided with an insulating layer 13, a first plate electrode 14 and a fixed electrode 15 (not shown in FIG. 4) was prepared.

The insulating layer 13 was prepared by thermally grown oxidation of the silicon substrate 1 by an oxidising gas, and typically the thickness of this insulating layer 13 is 1 $\mu$m. The first plate electrode 14 and the fixed electrode 15 were prepared by forming a 5 nm thickness Cr layer and a 20 nm thickness Au layer on the insulating layer 13 by electron beam deposition, and patterning by photolithography.

Figure 4A:
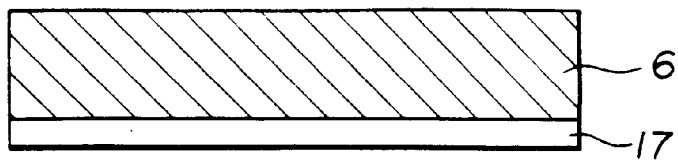
FIGS. 4(A)–4(L) are sectional views, which are taken on line 4—4 of FIG. 3, for illustrating a first process for producing the electrostatic actuator of FIG. 3.
Figure 4B:
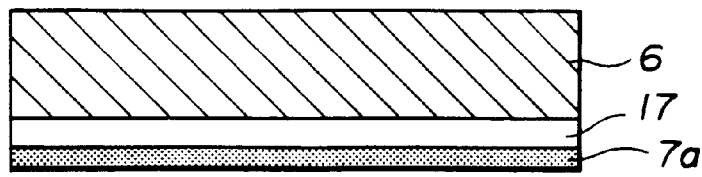
Figure 4C:
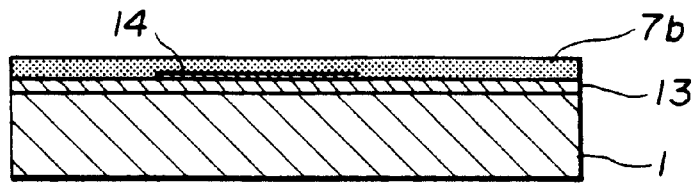

Next, a photoresist was coated on the first substrate to form a second photoresist layer 7b in the same manner as for the first photoresist layer 7a (FIG. 4(C)).

The first substrate 1 and the second substrate 6 were then heated at 50° C. for 10 minutes to regulate the amount of solvent in the photoresist layers 7a, 7b in order to avoid bubbles between the photoresist layers 7a, 7b when the photoresist layer 7a was adhered to the photoresist layer 7b.

Figure 4D:
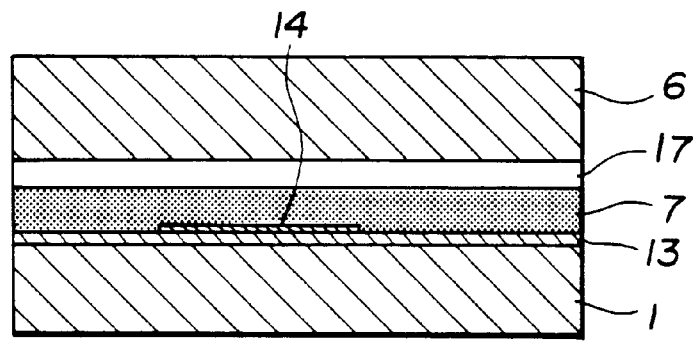

The second substrate 6 was then placed on the first substrate 1 with the photoresist layers 7a, 7b therebetween and 100 V of voltage was applied between the first substrate 1 and the second substrate 6 to adhere the substrates 1, 6 by the photoresist layers 7a, 7b, after which the photoresist layers 7a, 7b were then heated at 120° C. to cure the photoresist layers 7a, 7b and produced a consolidated photoresist layer 7 (FIG. 4(D)). The cured consolidated photoresist layer 7 was 2 $\mu$m thick.

Figure 4E:
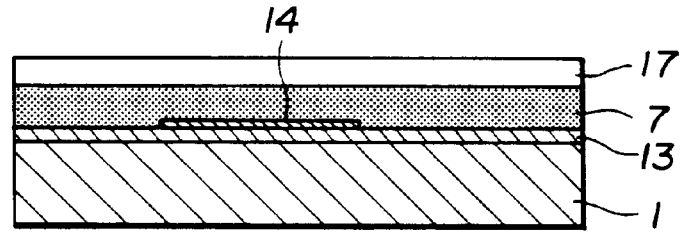

Next, the second substrate 6 was removed by wet etching using 30 wt % of KOH aqueous solution to expose the silicon nitride layer 17 (FIG. 4(E)).

In this step, silicon nitride was not etched substantially since the etching speed of silicon nitride is much lower than that of silicon.

Figure 4F:
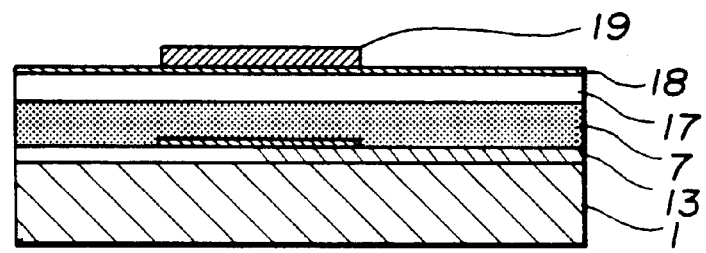

Next, a metal film 18 consisting of Cr and Au sub-layers was formed on the silicon nitride layer 17 in the same manner as for forming the first plate electrode 14 and the fixed electrode 15, and a patterned photoresist layer 19 was formed by photolithography (FIG. 4(F)).

Figure 4G:
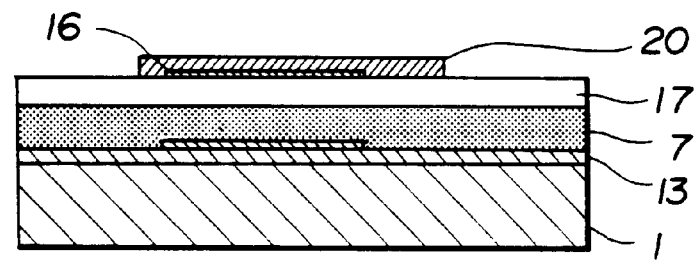
Figure 4H:
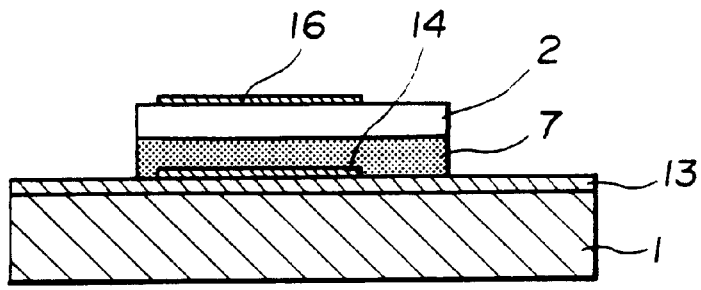
Figure 4I:
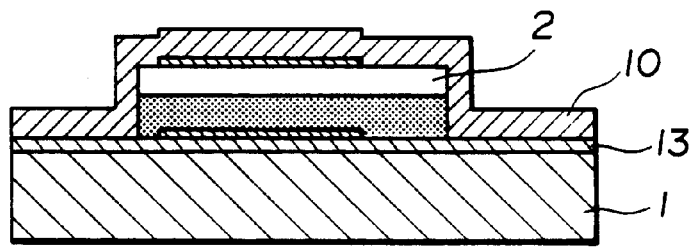
Figure 4J:
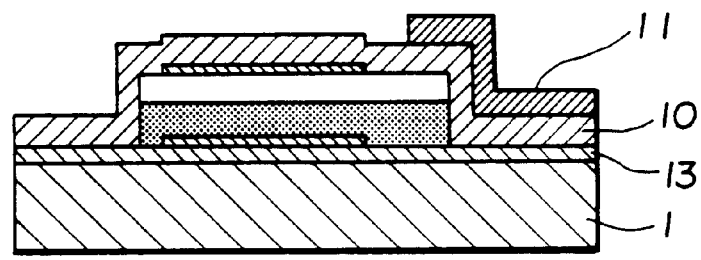
Figure 4K:
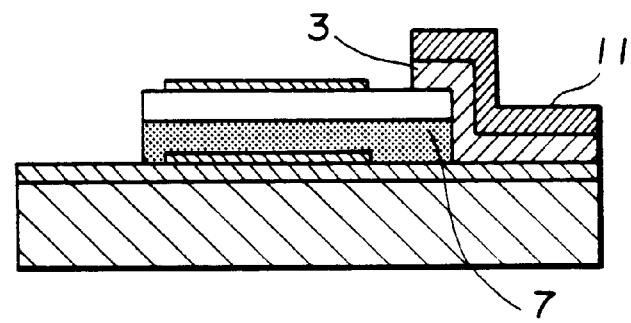

The metal film 18 was then etched by using the patterned photoresist layer 19 as a mask to form the second plate electrode 16, and then a patterned photoresist layer 20 whose pattern corresponded to the pattern of the beam member 2 was formed on the silicon nitride layer 17 (FIG. 4(G)).

The silicon nitride layer 17 was then etched by reactive ion etching using $CF_4$ gas with the patterned photoresist layer 20 as a mask. After this, the patterned photoresist layer 20 and exposed part of the photoresist layer 7 were ashed by reactive ion etching with oxygen gas and removed to complete production of the patterned beam member 2 (FIG. 4(H)).

Next, aluminum was deposited on the exposed surface of insulating layer 13 on the exposed surface of silicon nitride layer and on the second plate electrode 16 to form an aluminum layer 10, after which a patterned photoresist layer 11 was formed on the aluminum layer 10.

The aluminum layer 10 was then etched by reactive ion etching using a gas mixture of $BCl_3$ and $Cl_2$ to form the supporting structure 3.

Figure 4L:
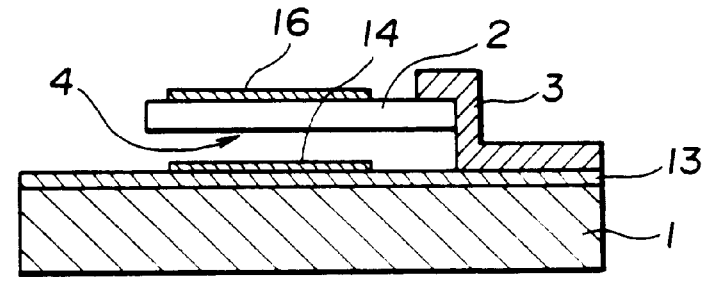

The patterned photoresist layer 11 and the patterned photoresist layer 7 were etched with oxygen plasma and an air space formed between the beam member 2 and the substrate 1 (FIG. 4(L)). The concentration of the oxygen was 50 ccm or more and pressure of the gas was 20 Pa or more to promote isotropic etching.

In this manner, a microstructure comprising a 2 $\mu$m air-space 4 and a 1 $\mu$m-thick beam member 2 as shown in FIG. 3 was prepared. In this example, a photoresist layer 7 was used as a first sacrificial layer. Each electrode was not etched and sticking, which would have happened if the sacrificial layer had been removed by wet etching, was avoided since dry etching was used.

Further, according to this embodiment of the present invention a silicon nitride layer formed on the second substrate was transferred onto the first substrate to form the beam member and a patterned plate electrode was formed on the beam member. This electrode was connected electrically to the fixed electrode formed on the first substrate by the supporting structure.

Furthermore, the free-end of the beam member, a cantilever portion, could be displaced toward the first substrate to correspond to the torsional twisting of the torsion bar portion of the beam member by applying a voltage between the first and second plate electrodes.

EXAMPLE 3

Figure 5:
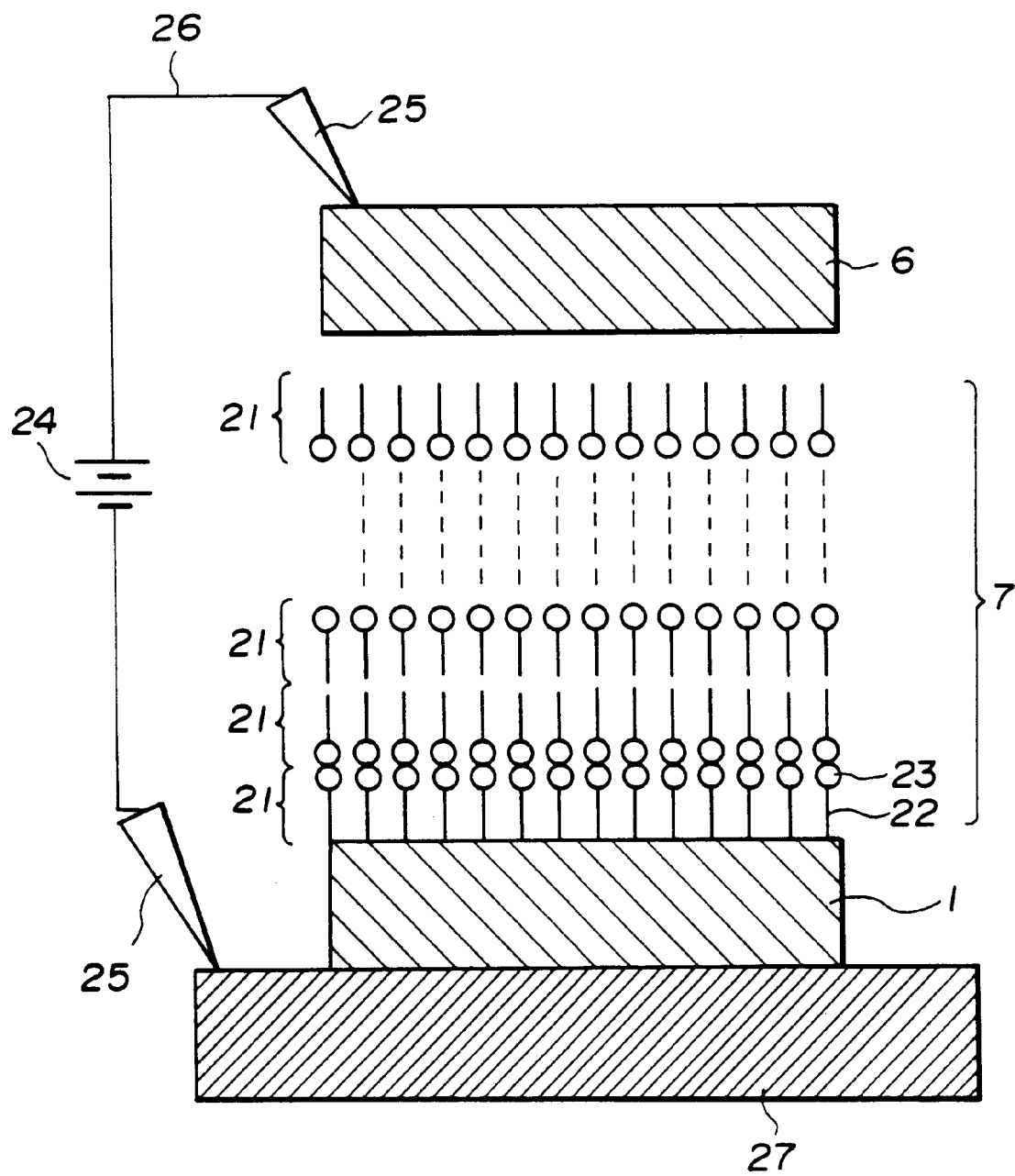
FIG. 5 is a sectional view for explaining the use of an L-B film in a process for producing a microstructure according to the present invention.

Another embodiment of a process for producing the microstructure shown in FIG. 1 will be explained with reference to FIG. 5. In this example, a LB layer was used as the first sacrificial layer 7 in Example 1, and FIG. 5 is a schematic view illustrating the step of adhering the first substrate to the second substrate by this first sacrificial layer. In this figure, 1 is a silicon first substrate, 6 is a silicon second substrate, 7 is an LB layer formed by the LB technique on the first substrate 1; the LB layer 7 consists of many LB film monomolecular sublayers 21, and the LB layer 7 is of thickness 80 nm. Further, 22 is a hydrophobic group and 23 is a hydrophilic group, and the LB film sub-layers 21 are laminated alternately with hydrophilic groups 23 adjacent and with hydrophobic groups 22 adjacent, as shown. 24 is a power supply to apply a voltage between the first substrate 1 and the second substrate 6, and it is connected to needle electrodes 25 by conductive wires 26. 27 is an electroconductive platen.

In this example, stearic acid was used for forming the LB layer 7 on the first substrate 1, and then the second substrate 6 having a patterned surface (not shown) was placed on the first substrate 1 with the LB layer 7 inbetween.

Next, 6 V of voltage was applied between the first substrate 1 and the second substrate 6 for 30 minutes to adhere the second substrate 6 to the first substrate 1 by using electrostatic force which was generated by the voltage, and the hydrophobic surface of the LB layer 7 was adhered to the hydrophobic surface of the second substrate 6.

Next, the adhered substrates 1, 6 were processed in the same manner as in the process of Example 1 as shown in FIGS. 2(E) to 2(J) to form a microstructure comprising an aluminum supporting structure 3 and a silicon beam member having the same structure as that shown in FIG. 2(J), except in using an LB layer instead of a PMMA layer as the first sacrificial layer 7. The microstructure was then heated at 350° C. for 1 hour to decompose and remove the LB layer 7, and a 80 nm air-space was formed between the first substrate 1 and the silicon beam member 2.

In this example, a microstructure having an air-space which is regulated to nm precision can be prepared by using an LB layer as the first sacrificial layer.

In addition, the LB layer can be removed by heating, so that sticking which can happen if the first sacrificial layer is removed by wet etching can be avoided.

Further, in this example, the LB layer 7 is formed on the first substrate 1. However, it can be formed on the second substrate 6, or can comprise sub-layers formed on the first substrate 1 and the second substrate 6. Examples of removing the LB layer 7 may include irradiating by laser, such as $CO_2$ laser to decompose the LB layer 7.

Furthermore, in this example, stearic acid was used for forming the LB layer 7, but arachidic acid, ferroelectric LB film, such as diacetylene type, benzene derivatives type, and polyimide LB film also can be used to form the LB layer 7 of the example.

Examples of the substrate 1 may include glass, metal, glass substrate on which metal film has been formed, etc.

EXAMPLE 4

Another embodiment for producing the microstructure shown in FIG. 3 will be explained with reference to FIG. 6.

Figure 6A:
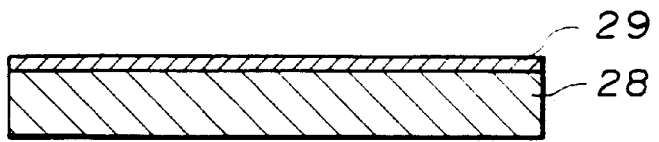
FIGS. 6(A)–6(M) are sectional views for illustrating a second process for producing the electrostatic actuator of FIG. 3.

First of all, a silicon substrate 28 was prepared, and a 200 nm thick aluminium layer 29 was formed on the silicon substrate 28 as a second sacrificial layer by electron beam deposition (FIG. 6(A)). Next, a glass substrate (trade name: No. 7740, mfd. by Corning) was prepared as the second substrate 6, after which the silicon substrate 28 having the aluminium layer 29 was bonded anodically to the glass substrate 6.

The bonding step will now be explained in detail with reference to FIG. 7.

Figure 7:
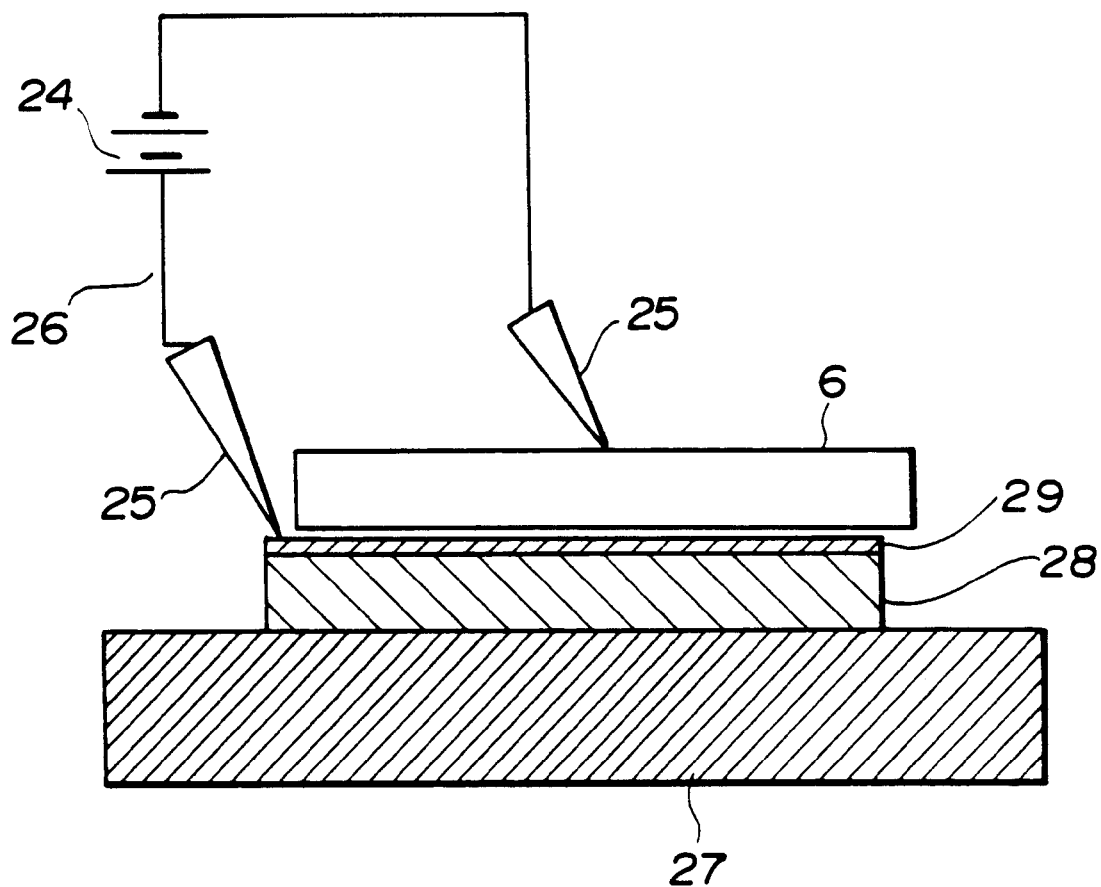
FIG. 7 is a schematic sectional view for explaining a step of bonding a silicon substrate to a second substrate anodically.

Referring to FIG. 7, 24 is a power supply for applying voltage between the aluminum layer 29 and the glass substrate 6, and it is connected with needle electrodes 26 by connecting wires 26, and 27 is an electroconductive platen comprising a heating means (not shown).

Figure 6B:
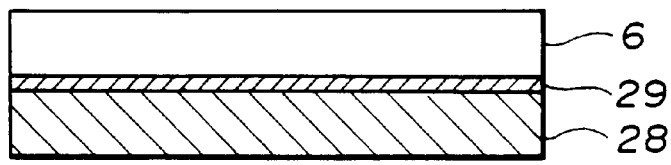

In the bonding step, the second substrate 6 was placed on the aluminum layer 29, after which 500 V of voltage was applied between the second substrate 6 and the aluminum layer 29 for 20 minutes at a platen temperature of 300° C. to bond the second substrate 6 to the silicon substrate 28 (FIG. 6(B)). The silicon substrate 28 was then abraded down to a layer of 2 μm-thickness (FIG. 6(C)).

Figure 6C:
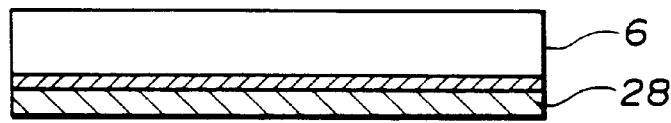
Figure 6D:
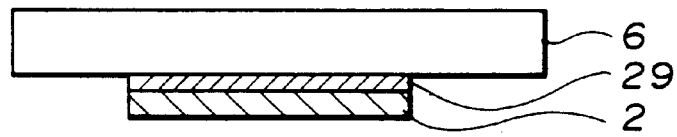
Figure 6E:
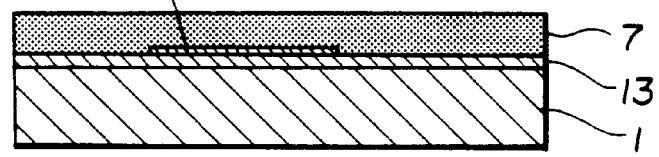
Figure 6F:
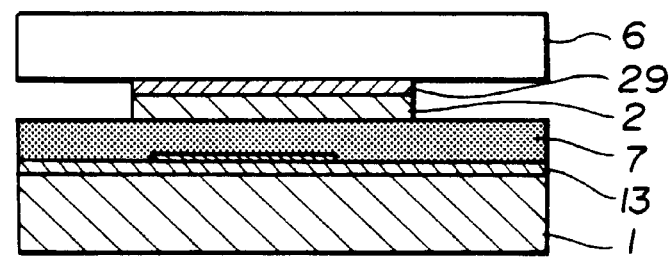

Next, a patterned photoresist layer, whose pattern corresponded to a beam pattern, was formed on the silicon layer 28, after which the silicon layer 28 was etched by reactive ion etching using $CF_4$ gas, after which the aluminum second sacrificial layer 29 was etched by reactive ion etching using a gas mixture of $BCl_3$ and $Cl_2$ to form the beam member 2 having a cantilever portion (FIG. 6(D)).

A silicon first substrate having an insulating layer 13, a first plate electrode 14, and a fixed electrode 15 was prepared. The insulating layer 13 had been formed in the same manner as in Example 2. In addition, the first plate electrode 14 and the fixed electrode 15 had been formed as follows: first of all, a 5 nm Cr layer and a 200 nm Au layer were formed on the insulating layer 13 by electron beam deposition, after which a patterned photoresist layer was formed on the Au layer, after which the Au layer was etched with an etchant comprising iodine and potassium iodide, and the Cr layer was etched with an etchant comprising cerium ammonium nitrate and perchloric acid.

Next, a rubber-type photoresist (trade name: OMR 83; mfd. by Tokyo Ouka Kogyo) was coated on the surface of the first substrate having the fixed elecrode 15 and the first plate electrode 14 to form the first sacrificial layer 7 (FIG. 6(E)).

The second substrate 6 having the beam member 2 was then pressed onto the first sacrificial layer 7, after which these substrates 1, 6 were heated at 150° C. to evaporate the organic solvent in the photoresist layer 7 and to cure it to adhere the second substrate 6 to the first substrate 1. The cured photoresist layer 7 had 2 μm of thickness.

Figure 6G:
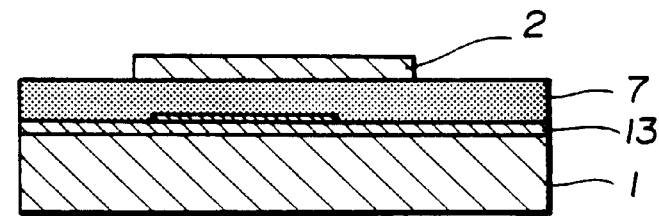

The aluminum second sacrificial layer 29 was then removed at 80° C. by an etchant comprising phosphoric acid, nitric acid and acetic acid to release the second substrate 6 (FIG. 6(G)). The beam member 2 was thus transferred to the first sacrificial layer 7.

The first sacrificial layer 7 and the first substrate 1 were not etched by the aluminum etchant.

Figure 6H:
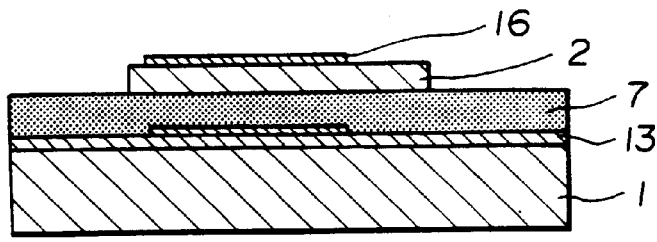

Next, the second plate electrode 16 was formed on the beam member 2 in the same manner as that for the fixed electrode 15 and the first plate electrode 14 (FIG. 6(H)).

Figure 6I:
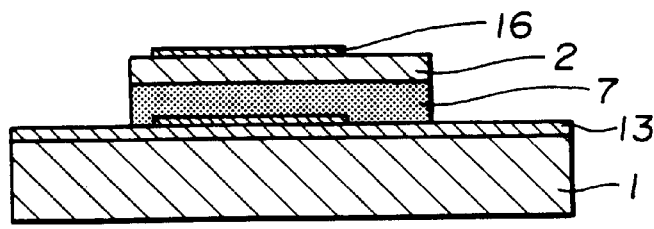

The first sacrificial layer 7 was then etched by reactive ion etching using oxygen-gas, and using the pattern of the beam as a mask (FIG. 6(I)).

Figure 6J:
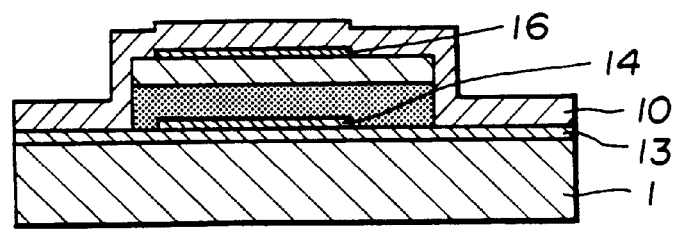
Figure 6K:
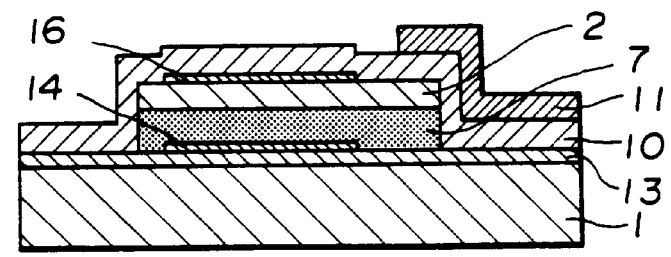
Figure 6L:
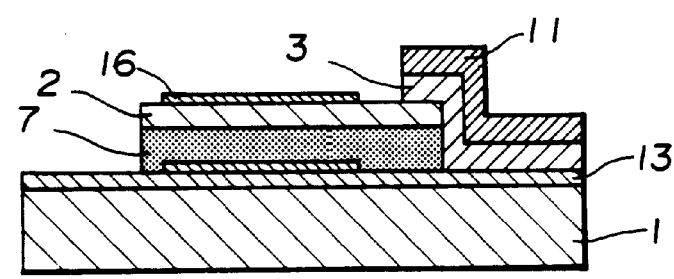

Next, aluminum was deposited on the insulating layer 13, the beam member 2 and the second plate electrode 16 to form 2 μm of aluminum layer 10 (FIG. 6(J)), after which a patterned photoresist layer 11, whose pattern corresponds to the pattern of the supporting means 3, was formed on the aluminum layer 10 (FIG. 6(K)). The aluminum layer 10 was then etched by reactive ion etching using a gas mixture of $BCl_3$ and $Cl_2$ to form the supporting means 3.

Figure 6M:
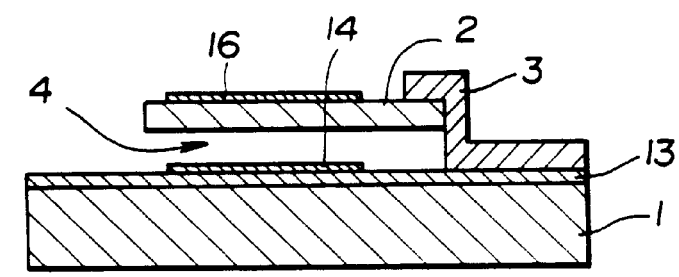

The photoresist layer 11 and the first sacrificial layer 7 were then removed by etching with oxygen plasma to form a microstructure having a space 4 (FIG. 6(M)).

According to this example, a microstructure having a 2 μm air space 4 and a 2 μm-thickness silicon beam member 2 having a cantilever portion supported by an aluminum supporting structure 3 was prepared, and in addition each electrode 14, 15, 16 was not etched and sticking was avoided by using reactive ion etching.

According to the process for producing the microstructure in this example, a beam member 2 which does not have internal stress and which is not bent can be formed from processing the substrate 28 made of crystalline silicon, and the beam member can be connected electrically with the fixed electrode 15 formed on the first substrate 1 by the supporting structure 3.

Examples of the substrate 1 may include silicon, glass, GaAs, metal, a glass substrate on which a metal film has been formed, etc.

In the above step, where the silicon beam member 2 is adhered to the first substrate 1 by the first sacrificial layer 7, a voltage of 100 V can be applied between the beam member 2 and the first substrate 1 to generate electrostatic force, instead of applying pressure.

In the process according to Example 4, there is an alternative step for producing the beam member 2. This step is as follows:

First of all, an SOI substrate having a 2 μm-thickness silicon layer is prepared, after which the aluminum layer 29 is formed on the silicon layer. Next, the silicon layer is bonded anodically to the second substrate 6. In performing this step, the SOI substrate was etched with 30 wt % of KOH aqueous solution to remove the silicon base substrate of the SOI substrate. The silicon dioxide layer acts as an etch stop layer so that once the silicon substrate is removed, the etching is stopped. Next, the silicon dioxide layer is removed by hydrogen fluoride aqueous solution to produce a laminated second substrate comprising a 2 μm-thick silicon layer 28 on the second sacrificial layer 29 and the second substrate, the same structure as shown in FIG. 6(c). In this case, the thickness of the layer for the beam member 2 can be guaranteed.

Alternatively, the SOI substrate can be used directly as a laminated second substrate as shown in FIG. 6(C), in which case the buried thermally grown silicon dioxide serves as the second sacrificial layer instead of aluminum. The silicon layer of the SOI substrate is etched to form a pattern in the same manner as that shown in FIG. 6(D), after which the patterned silicon film 2 is adhered to the first substrate 1 shown in FIG. 6(E). The buried silicon dioxide is then removed with hydrogen fluoride to transfer the patterned silicon layer onto the first sacrificial layer 7 as shown in FIG. 6(G).

In this example, aluminum film was used as the second sacrificial layer, but other metal which can be bonded anodically, such as Ti, Cr, Ni etc., and a selective etchant chosen which does not erode the first sacrificial layer 7 and the beam member 2. Furthermore, a first sacrificial layer 7 of resin can serve as an adhesive layer, in which case the layer 28 should be grooved so that solvent vapour evaporated can escape in the step of curing the first sacrificial layer 7 (FIG. 6(F)).

EXAMPLE 5

Another process for producing the microstructure electrostatic actuator of FIG. 3 will be explained with reference to FIG. 8. First of all, a silicon substrate 30 was provided having a 1 μm-thick thermally grown silicon dioxide layer 31 which is to form the beam member 2. Next, a 200 nm Cu layer and a 10 nm Al layer were formed on the silicon dioxide layer 31 by sputtering to form the second sacrificial layer 29 (FIG. 8(A)).

The second sacrificial layer 29 was then bonded anodically to a second substrate 6 of glass (trade name: No. 7740; mfd. by Corning) in the same manner as that in Example 4 (FIG. 8(B)). When the second sacrificial layer 29 was bonded anodically to the second substrate 6, the aluminum in the second sacrificial layer 29 was dispersed into the copper layer to form an alloy of aluminum and copper at the interface of the Al layer and the Cu layer. The silicon substrate 30 was then removed by dry etching using $SF_6$ gas (FIG. 8(C)).

This etching step was selective and therefore the silicon oxide layer 31 remained on the second substrate 6.

As the first substrate 1, a glass substrate (trade name: No. 7059; mfd. by Corning) was prepared, and the first plate electrode 14 and fixed electrode 15 (not shown in FIG. 8) were formed on the first substrate 1 in the same manner as in Example 4. Next, a solution in which PMMA had been dissolved into MEK was coated on the electrode surface of the first substrate 1 to form the first sacrificial layer 7 (FIG. 8(D)). The first substrate 1 was then heated at 50° C. for 10 minutes to regulate the amount of the solvent in the first sacrificial layer 7 to prevent bubbles forming at the adhesive interface when the first substrate 1 is later adhered to the second substrate 6.

Figure 8A:
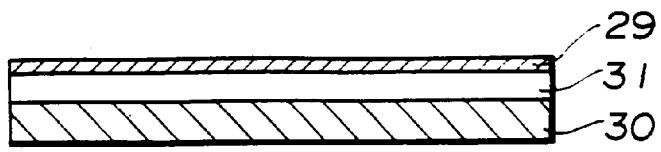
FIGS. 8(A)–8(M) are sectional views for illustrating a third process for producing the electrostatic actuator of FIG. 3.
Figure 8B:
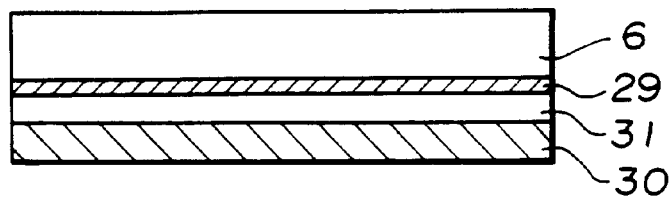
Figure 8C:
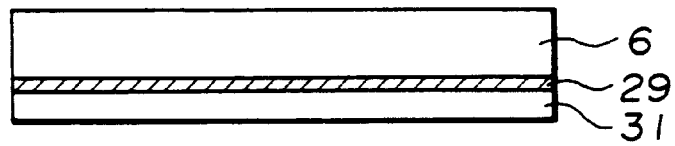
Figure 8D:
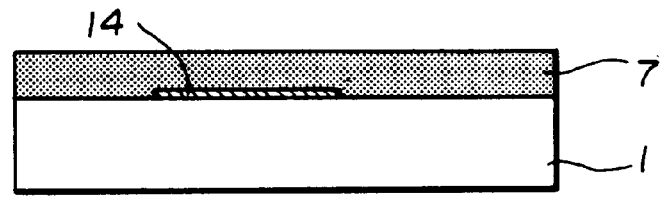
Figure 8E:
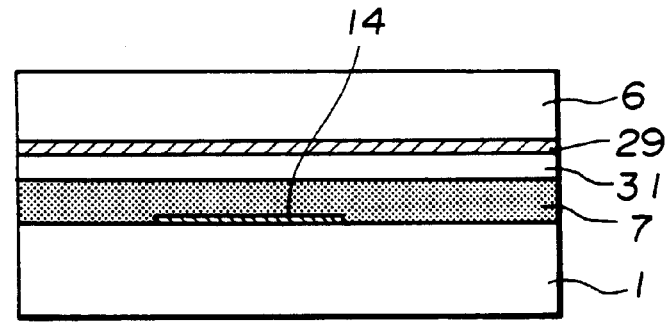

Next, the second substrate 6 as shown in FIG. 8(C) was pressed onto the first substrate 1 shown in FIG. 8(D) bringing the silicon dioxide layer 31 into contact with the first sacrificial layer 7 (FIG. 8(E)).

The pressure was regulated in order that the silicon dioxide layer 31 was adhered adequately to the first sacrificial layer 7.

The first layer 7 was then cured at 150° C. The cured first sacrificial layer 7 had a 2 μm thickness.

Figure 8F:
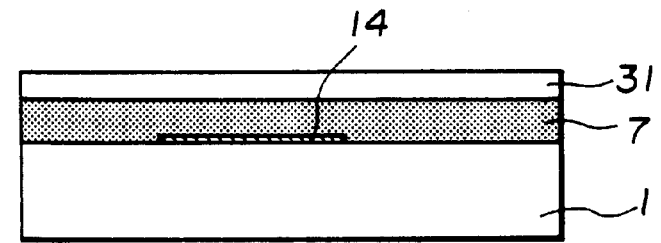

The second sacrificial layer 29 was then removed by an etchant selective for copper comprising $FeCl_3$, to release the second substrate 6, and to transfer the silicon dioxide film 31 onto the first sacrificial layer 7 (FIG. 8(F)).

Figure 8G:
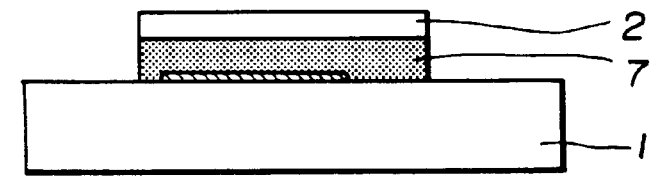

Next, a patterned photoresist layer was formed on the silicon dioxide layer 31, and the silicon dioxide layer 31 was then etched with hydrogen fluoride using the patterned photoresist layer as a mask to form the beam member 2; after which the patterned photoresist was removed by reactive ion etching with oxygen gas, and in this etching step for the photoresist, the first sacrificial layer 7 was also etched to form a patterned first sacrificial layer, whose pattern was the same as the pattern of the bridge member 2 (FIG. 8(G)).

Figure 8H:
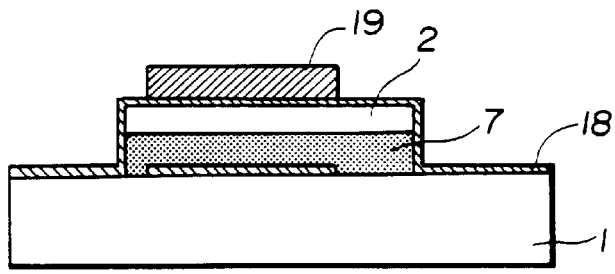
Figure 8I:
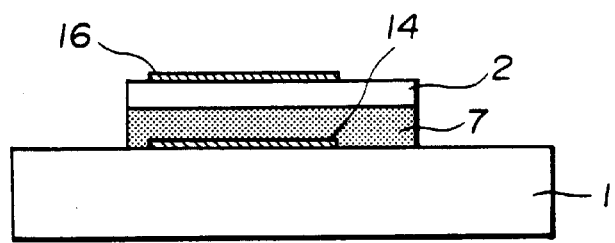
Figure 8J:
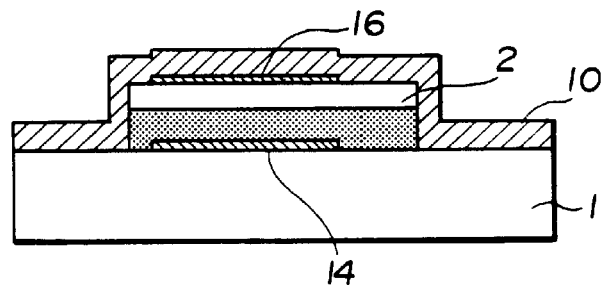
Figure 8K:
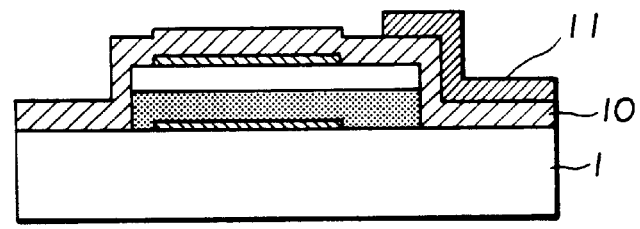
Figure 8L:
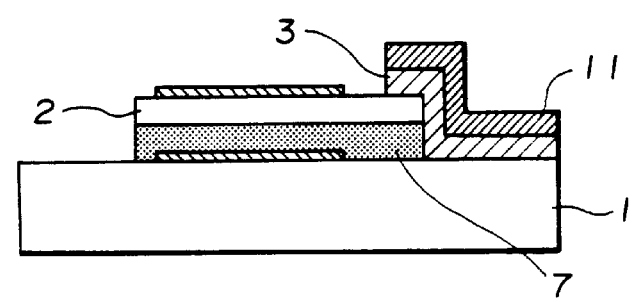
Figure 8M:
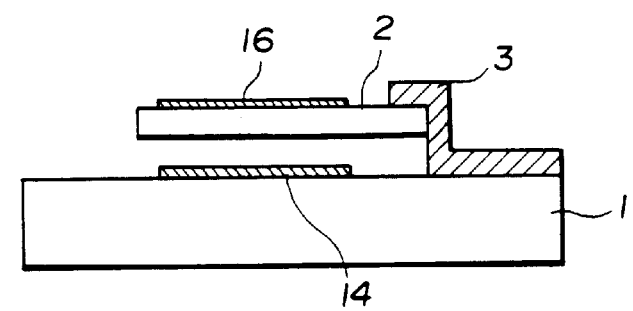

Next, the second plate electrode 16 was formed on the beam member 2 in the same manner as in Example 4 (FIGS. 8(H), (I)), after which a 2 μm-thick aluminum layer 10 was formed (FIG. 8(J)). Next, a patterned photoresist layer 11 was formed and the aluminum layer 10 was etched to form the supporting structure 3 in the same manner as in Example 4 (FIGS. 8(K), (L)), after which the patterned photoresist layer 11 and the first sacrificial layer 7 of PMMA were removed by immersion in an organic solvent for removing the photoresist (trade name: OMR Remover—502; mfd. by Tokyo Ouka Kogyo K.K.) to prepare a microstructure having a 2 µm air space 4 and a 1 µm-thick silicon dioxide beam member 2 supported by an aluminum supporting structure 3.

Since an organic solvent was used the aluminum supporting structure 3 was not etched.

The microstructure prepared in this example had the same structure as the electrostatic actuator shown in FIG. 3 except for using a glass substrate 1. The thermal expansion coefficient of glass is one order of magnitude larger than that of the thermally grown silicon oxide, but nevertheless a microstructure with a structure made of insulating material is formed on a substrate whose thermal expansion coefficient is different from that of the insulating material can be prepared.

In this example, as the first substrate 1, a glass substrate was used, but other insulating material, such as quartz, $Al_2O_3$, MgO, $ZrO_2$, etc., or semiconductor material, such as Si, GaAs, InP etc. or metallic materials can be used.

In addition, in this example, as the layer for the structure, silicon dioxide was used, but other insulating material, which can be processed as film, such as silicon nitride, $Al_2O_3$, APN etc. can be used.

Further, the layer 31 for the beam member 2 may be formed after forming the second sacrificial layer 29 on the second substrate 6. Furthermore, examples of the second sacrificial layer in Example 5 may include a layer which can be bonded anodically to the second substrate 6, such as an alloy layer of Cu and Al formed by sputtering.

In Example 5, the second sacrificial layer 29 was removed by wet etching, but it can be removed by dry etching with oxygen gas.

EXAMPLE 6

Another example of a process for producing a microstructure as shown in FIG. 1 will be explained with reference to FIG. 9. First of all, a substrate of crystalline silicon was prepared as a second substrate 6, and the second substrate 6 was etched to form a patterned prominence 9 of the beam 2 in the same manner as in Example 1 (FIGS. 9(A), (B)). The height of the prominence 9 was 5 µm.

A glass substrate (trade name: No. 7059; mfd. by Corning) was prepared as a first substrate 1.

Next, a solution of a precursor of polyimide was coated on the first substrate 1 by spin coating, after which the first substrate 1 was heated at 250° C. to harden the precursor to form a 2 µm-thick polyimide layer 7c. Next, a solution in which PMMA had been dissolved into MEK was coated on the polyimide layer 7c to form a 0.5 µm-thick PMMA layer 7d (FIG. 9(C)).

In this example, the polyimide layer 7c and the PMMA layer 7d constituted a first sacrificial layer 7.

Figure 9A:
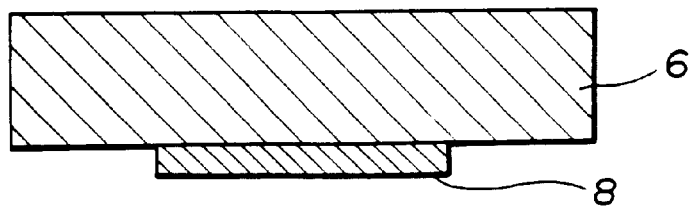
FIGS. 9(A)–9(K) are sectional views for illustrating a second process for producing the microstructure of FIG. 1.
Figure 9B:
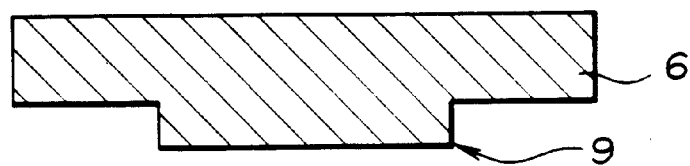
Figure 9C:
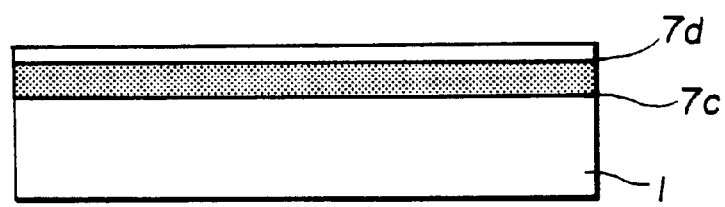
Figure 9D:
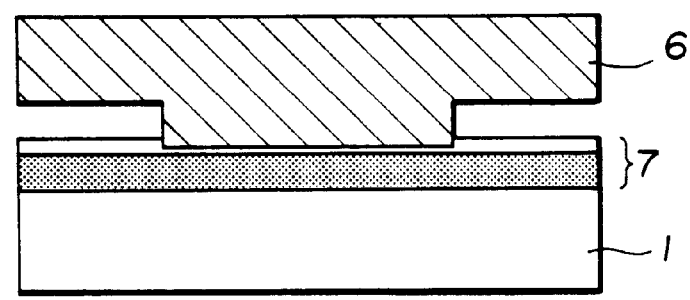
Figure 9E:
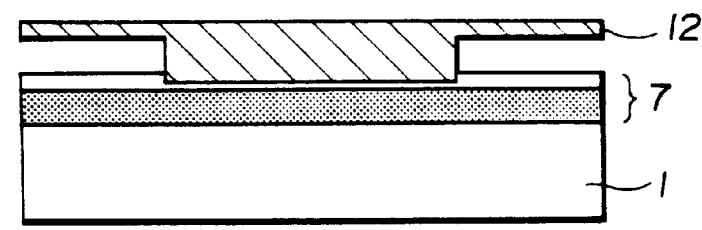
Figure 9F:
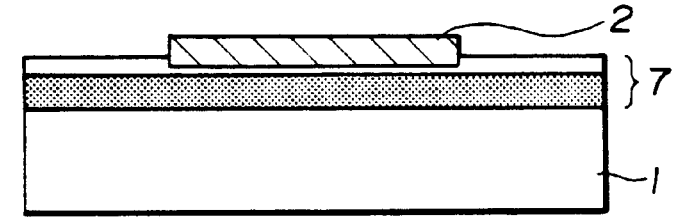
Figure 9G:
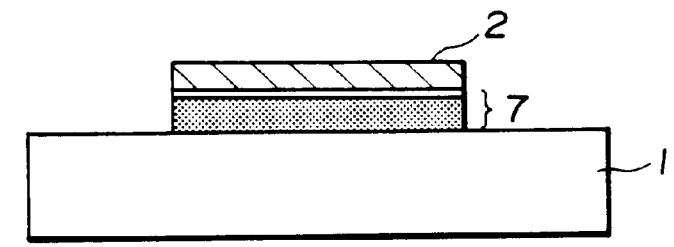

Next, the second substrate 6 was placed on the first substrate 1 with the prominence 9 in contact with the PMMA layer 7d, after which the substrates 1, 6 were heated at 150° C. to cure the PMMA layer 7d, and to adhere the second substrate 6 to the first substrate 1 (FIG. 9(D)). The first substrate 1 was then etched to form the beam member 2 on the PMMA layer 7d in the same manner as in Example 1, then using the beam member 2 as a mask, part of the first sacrificial layer 7 was removed by reactive ion etching using oxygen gas (FIG. 9(G)).

Figure 9H:
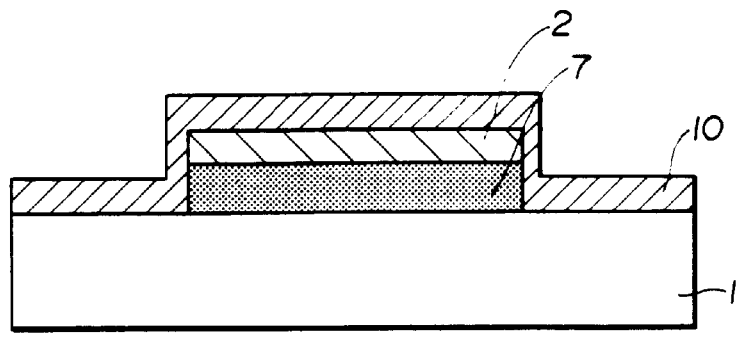
Figure 9I:
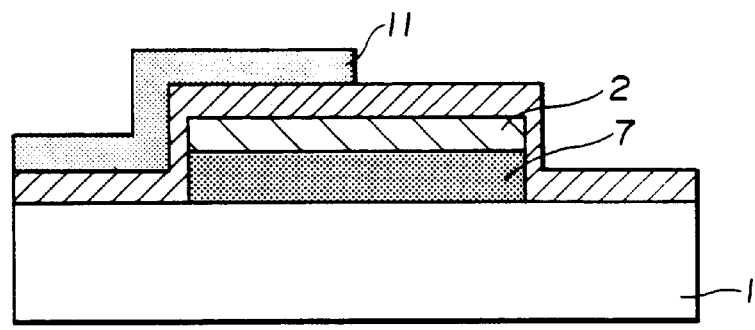
Figure 9J:
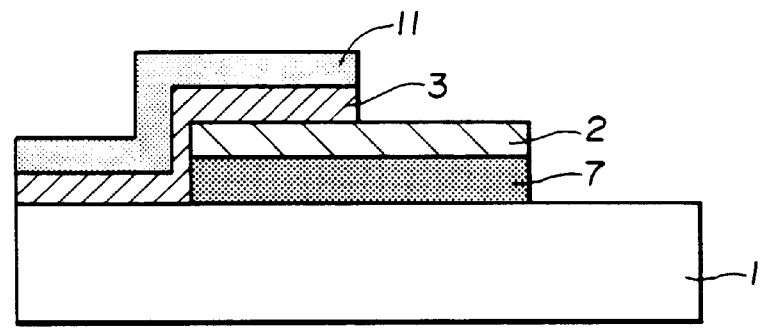
Figure 9K:
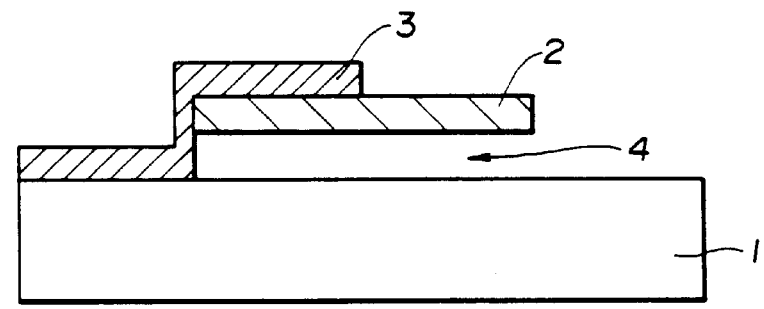

Next, the aluminum supporting structure 3 was formed in the same manner as in Example 1 (FIGS. 9(H) to 9(J)).

Finally, the patterned photoresist layer 11 and the first sacrificial layer 7 were removed to prepare a microstructure comprising a silicon beam member 2 on the substrate 1 and having an air-space 4 between the beam member 2 and the substrate 1 and the beam member 2 was suspended by the aluminum supporting structure 3.

According to this example, sticking could be avoided by using dry etching with oxygen plasma.

In addition, according to the process of this example, a beam member which does not have internal stress, and which is not bent can be prepared because of forming the beam member by processing crystalline silicon crystal to a thin layer. The silicon substrate 6 was provided with a groove beside the prominence 9 so that solvent vapor, evaporated in the step of curing the PMMA layer 7c, could escape.

If the surface area of the prominence 9 is large, the amount of the solvent in the resin layer may be regulated to avoid bubbles being trapped at the adhesive interface.

The amount of the solvent can be regulated by heating the resin layer at a low temperature at which the resin layer is not cured. It is possible to avoid bubbles in the 0.5 µm thickness of PMMA layer by heating at 50° C. for 10 minutes.

Furthermore, in this example, a resin layer (PMMA layer) was used as an adhesive layer so that the adhesive layer could be cured at 150° C. Thereby, it is possible to use, as the second substrate, a substrate whose thermal expansion coefficient is different from that of the first substrate.

Examples of the first substrate 1 may include an insulator, such as quartz, $Al_2O_3$, MgO, $ZrO_2$, etc., a semiconductor, such as Si, GaAs, InP, or metallic materials.

According to this example, in the step for adhering the second substrate 6 to the first substrate 1, the prominence 9 is embedded into the PMMA layer 7d, but it is not embedded into the polyimide layer 7c as shown in FIG. 9(D) so the polyimide layer acts as a layer for regulating the thickness of the air-space 4. By dividing the functions of the first sacrificial layer 7, firstly defining the air space, and secondly providing adhesion, by using a laminated layer structure, the air space can be regulated with good accuracy even if the substrate is warped and/or pressure is not applied uniformly when the second substrate 6 is adhered to the first substrate 1.

EXAMPLE 7

Test for Repeatability of the Space Between the Beam and the First Substrate

First a 5 cm diameter glass substrate was provided as a first substrate 1. This glass substrate 1 was provided with a 200 nm-thick Cr layer on its surface, and it was warped due to the internal stress of the Cr layer.

Next, a 2 µm-thick polyimide layer 7c and a 0.5 µm-thick PMMA layer 7d were formed on the Cr layer in the same manner as in Example 6 to form a first sacrificial layer 7.

In addition, a 5 cm diameter silicon wafer substrate was provided as a second substrate 6, and the second substrate 6 was provided with four beam members each produced in the same manner as in Example 6. Each pattern had a 100 µm-width, a 20 mm-length and were separated at a 10 mm-pitch.

Next, by using the first substrate 1 and the second substrate 6, the first substrate 1 having four silicon beams on the PMMA layer 7d in the same manner as in Example 6, and as disclosed in FIGS. 9(D) to (G). The silicon beams 2 were then etched away, and the thickness of the first sacrificial layer 7 was measured. The thickness was within the range of 2–2.2 µm.

On the other hand, another first substrate 1 having four silicon beams 2 was prepared in the same manner as described above except in forming a 2.5 µm-thickness PMMA layer 7 instead of forming a 2 µm-thickness of polyimide layer 7c and 0.5 µm-thickness of PMMA layer 7d. Next, the beams 2 were etched away, and the PMMA layer thickness was measured. The thickness was in the range from 1.5 µm to 2.4 µm. This confirms that better accuracy is achieved by dividing the functions as aforesaid.

EXAMPLE 8

Another example of producing the micro-structure of FIG. 3 will be explained with reference to FIG. 10.

A microstructure as shown in FIG. 3 was prepared in the same manner as in Example 4 (FIG. 6) except in using a first sacrificial layer 7 consisting of two photoresist layers 7c, 7d instead of a single photoresist layer.

The first sacrificial layer 7 in this example was prepared as follows:

a rubber type photoresist (trade name: OMR-83; mfd. by Tokyo Ouka Kogyo K.K.) was coated on the surface of the first substrate 1 including the fixed electrode 15 and the first plate electrode 14 to form a first photoresist layer 7c, after which the first photoresist layer 7c was heated at 80° C. for 20 minutes to evaporate solvent in the photoresist layer, after which ultraviolet radiation was irradiated to the photoresist layer. The photoresist layer 7c was then heated at 150° C. for 1 hour to cure it. Next, the same photoresist was coated on the first photoresist layer 7c to form 0.4 mm-thickness of a second photoresist layer 7d. In addition, the second photoresist layer 7d was cured when the second substrate 6 was adhered to the first substrate 1.

Figure 10A:
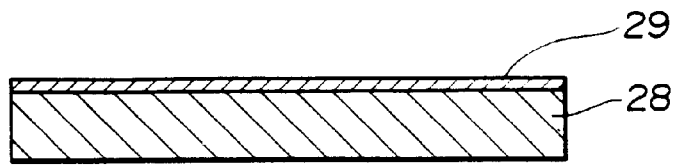
FIGS. 10(A)–10(M) are sectional views for illustrating a fourth process for producing the electrostatic actuator of FIG. 3.
Figure 10B:
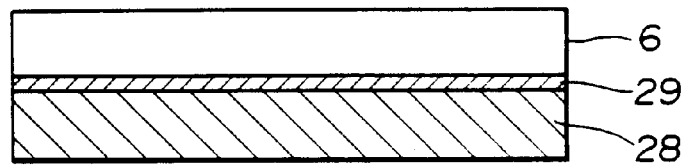
Figure 10C:
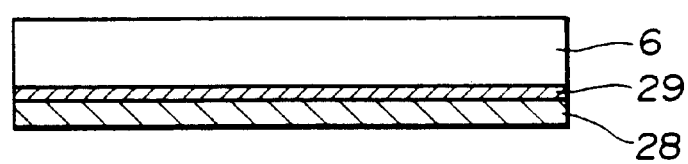
Figure 10D:
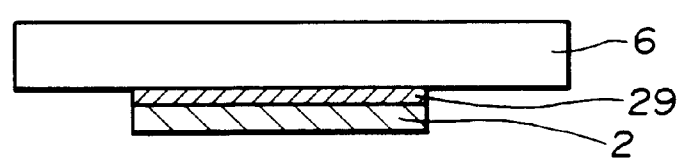
Figure 10E:
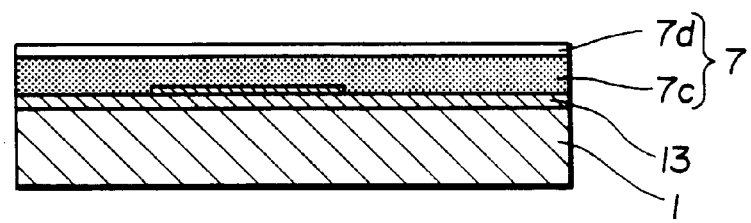
Figure 10F:
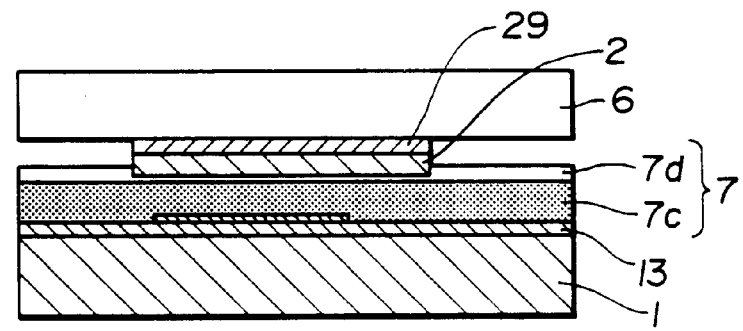
Figure 10G:
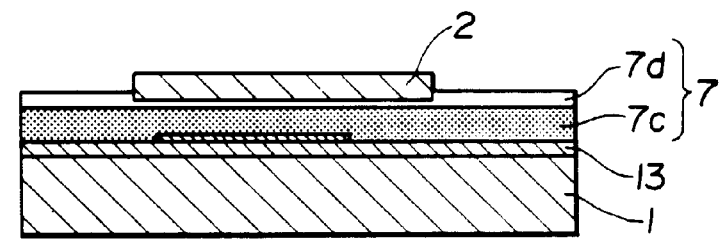
Figure 10H:
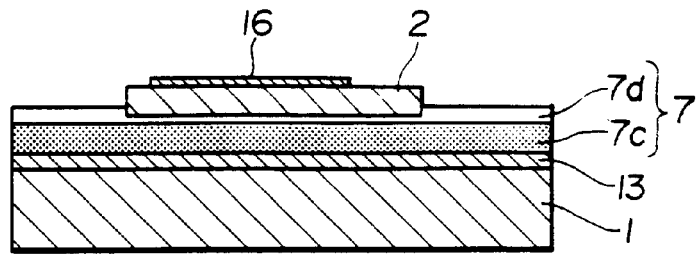
Figure 10I:
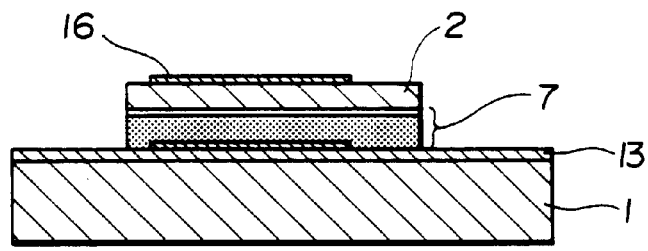
Figure 10J:
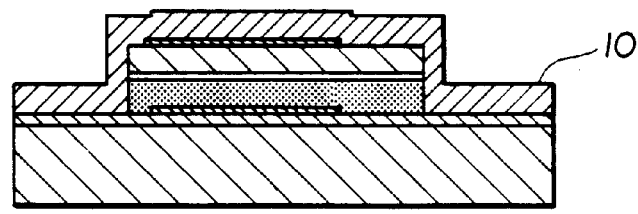
Figure 10K:
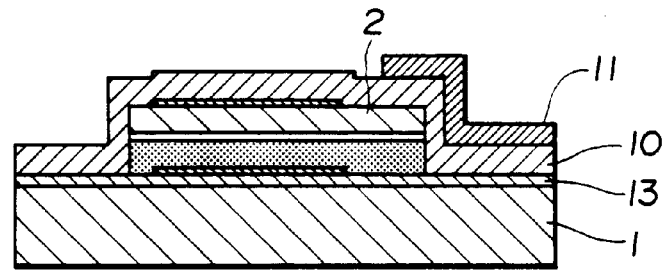
Figure 10L:
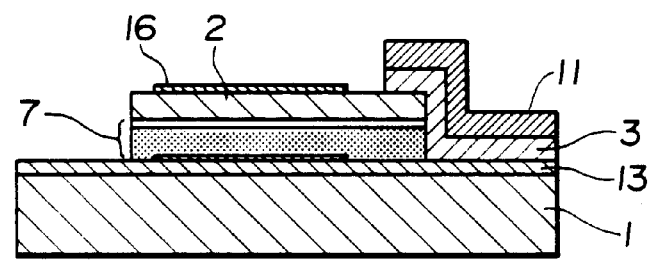
Figure 10M:
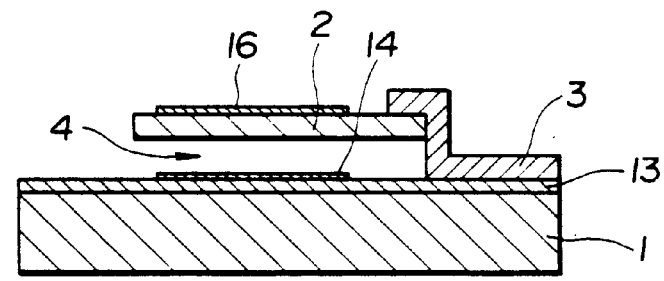

According to this example, in the step for adhering the second substrate 6 to the first substrate 1, the patterned part to form the beam member 2 is embedded in the second photo-resist layer 7d, but it is not embedded in the first photoresist layer 7c as disclosed in FIG. 10(F) so the first photoresist layer 7c works as a layer for regulating the air-space 4.

Therefore, in case of dividing the functions of the first sacrificial layer 7, one of which is a function as a layer for defining the thickness of the air space 4, and one of which is a function as a layer for adhering the first substrate 1 to the second substrate 6, into each function, the space can be regulated with a good accuracy even if the substrate 1 is warped and/or pressure is not applied uniformly when the second substrate 6 is adhered to the first substrate 1.

Further, in the step for adhering the second substrate 6 to the first substrate 1 (FIG. 10(F)), it was possible to adhere the second substrate 6 to the first substrate 1 by applying 100 V of voltage between the second sacrificial layer 29 made of Al and the first substrate 1 made of silicon instead of applying pressure to the back surface of each substrate 1, 6. In the above case, the second sacrificial layer 29 was not etched in the step of preparing the beam member 2 (FIG. 10(D)).

As described above:

(i) A microstructure comprising a substrate, a patterned structure provided on the substrate and spaced apart therefrom by an air-space, and a supporting structure which suspends the patterned structure can be obtained;

(ii) It is possible to obtain a microstructure made of various materials, such as insulators, metals and semiconductors;

(iii) It is possible to obtain a microstructure comprising a patterned structure on which is a patterned electrode connected electrically with the substrate of the microstructure, or with a fixed electrode formed on the substrate of the microstructure;

(iv) The material for a layer for the patterned structure, and the material for the first substrate are not limited because the step for processing the layer to form the structure can be performed independently.

(v) It is possible to obtain a microstructure comprising a patterned structure on a substrate over an air-space, wherein the structure is not warped if crystalline material is used as material for the structure;

(vi) If a resin layer is provided as the first sacrificial layer for forming a space between the substrate and the patterned structure, the first sacrificial layer can be removed by using a dry etching process, thereby sticking can be avoided, and a flat surfaced first sacrificial layer can be provided on the substrate without depending on the surface roughness of the substrate because resin layers can be made flat even if they are coated on uneven surfaces, for example, a substrate having a patterned electrode, therefore a second substrate can be adhered to the first substrate precisely;

(vii) A microstructure can be prepared by using a second substrate whose thermal expansion coefficient is different from that of the substrate of the microstructure because the process for producing microstructure according to the above does not comprise a step in which the substrate is bonded to the second substrate at high temperature;

(viii) If the functions of the first sacrificial layer of spacing and adhesion are divided amongst component layers, the air-space between the substrate and the patterned structure of the microstructure can be regulated precisely.

What is claimed is:

1. A process for producing a microstructure, said process comprising the steps of:
   (a) providing a first substrate having a first sacrificial layer over its surface and a beam member on said first sacrificial layer;
   (b) forming supporting means over said beam member with the inside surface of said supporting means attached to that surface of said beam member which is further from said first substrate; and
   (c) removing said first sacrificial layer to form an air-space between said beam member and said first substrate.

2. A process according to claim 1 wherein step (a) includes:
   (d) providing a second substrate of material which is to form said beam member;
   (e) producing a beam member patterned prominence (9) in the surface of said second substrate;
   (f) attaching said beam member patterned prominence to said first substrate by means of said first sacrificial layer; and
   (g) thinning said second substrate to form said beam member from said beam member patterned prominence.

3. A process according to claim 2 wherein said second substrate is a crystalline material.

4. A process according to claim 1 wherein step (a) includes:
- (h) providing a second substrate having a precursor layer thereon which is a material which is to form said beam member;
- (i) attaching said precursor layer to said first substrate by means of said first sacrificial layer;
- (j) removing said second substrate; and
- (k) producing said beam member by patterning said precursor layer.

5. A process according to claim 4 wherein said precursor layer provided on said second substrate is produced by thermal oxidation of said second substrate.

6. A process according to claim 4 wherein said precursor layer provided on said second substrate is attached thereto by means of a second sacrificial layer, and step (j) is performed by removing said second sacrificial layer to release said second substrate.

7. A process according to claim 6 wherein step (h) is performed by:
- providing a third substrate of a material which is to form said precursor layer;
- forming said second sacrificial layer (29) on said third substrate;
- attaching said third substrate to said second substrate by means of said second sacrificial layer; and
- thinning said third substrate to produce said precursor layer.

8. A process according to claim 7 wherein said third substrate is a crystalline material.

9. A process according to claim 6 wherein said second substrate, second sacrificial layer and precursor layer are comprised of an silicon-on-insulator substrate.

10. A process according to claim 4 wherein said step (k) of patterning said precursor layer is performed after said step (j) of removing said second substrate.

11. A process according to any one of claims 4 to 9, wherein said step (k) of patterning said precursor layer is performed before said step (i) of attaching said precursor layer to said first substrate.

12. A process according to claim 2 wherein said first sacrificial layer is of resin and the step of attaching to said first substrate is performed by using the first sacrificial layer as an adhesive layer.

13. A process according to claim 12 wherein said resin contains a photoresist.

14. A process according to claim 13 wherein said photoresist comprises cyclised rubber.

15. A process according to claim 12 wherein said first sacrificial layer is removed by dry etching.

16. A process according to claim 15 wherein said dry etching is performed using an oxygen plasma.

17. A process according to claim 2 wherein said first sacrificial layer is a multi-layer Langmuir-Blodgett film which prior to the removing step is provided on one or both of said first and second substrates.

18. A process according to claim 17 wherein an electrostatic field is applied across said first sacrificial layer for performing the removing step.

19. A process according to claim 12 wherein said first sacrificial layer is removed by means of a solvent.

20. A process according to claim 17 wherein said first sacrificial layer is removing by heating.

21. A process according to claim 6, wherein said second sacrificial layer is a metal.

22. A process according to claim 21 wherein said precursor layer is attached to said second substrate by anodic bonding with said second sacrificial layer of metal.

23. A process according to claim 1 wherein step (a) includes forming a patterned electrode on said surface of said beam member.

24. A process according to claim 2, wherein said sacrificial layer is provided on one or both of said first and second substrate prior to the attaching step.

25. A process according to claim 4, wherein said first sacrificial layer is provided on one or both of said first and second substrate prior to the attaching step.

* * * * *

UNITED STATES PATENT AND TRADEMARK OFFICE
CERTIFICATE OF CORRECTION

PATENT NO. : 6,020,215

DATED : February 1, 2000

INVENTOR(S): TAKAYUKI YAGI, ET AL.

Page 1 of 3

It is certified that error appears in the above-identified patent and that said Letters Patent is hereby corrected as shown below:

COVER PAGE AT ITEM [56]:
Attorney, Agent, or Firm: "Fitxpatrick, Cella, Harper & Scinto" should read --Fitzpatrick, Cella, Harper & Scinto--.

COLUMN 2:
Line 33, "oxidised" should read --oxidized--; and
Line 67, "having" should read --having;--.

COLUMN 4:
Line 6, "First, the first" should read --The first--; and
Line 43, "therefore" should read --therefore,--.

COLUMN 6:
Line 22, "which" should read --in which--.

COLUMN 9:
Line 59, "oxidising" should read --oxidizing--.

COLUMN 11:
Line 27, "inbetween" should read --in between--.

COLUMN 13:
Line 36, "First of all" should read --First,--.

UNITED STATES PATENT AND TRADEMARK OFFICE
CERTIFICATE OF CORRECTION

PATENT NO. : 6,020,215

DATED : February 1, 2000

INVENTOR(S): TAKAYUKI YAGI, ET AL.                    Page 2 of 3

It is certified that error appears in the above-identified patent and that said Letters Patent is hereby corrected as shown below:

COLUMN 16:
Line 50, "Repeatability" should read --repeatability--; and "Space Between the Beam" should read --space between the beam--;
Line 51, "First Substrate" should read --first substrate.--; and
Line 52, "First" should read --First;--.

COLUMN 17:
Line 47, "is a function" should read --functions--.

COLUMN 19:
Line 34, "an" should read --a--.

UNITED STATES PATENT AND TRADEMARK OFFICE
CERTIFICATE OF CORRECTION

PATENT NO. : 6,020,215

DATED : February 1, 2000

INVENTOR(S): TAKAYUKI YAGI, ET AL.

It is certified that error appears in the above-identified patent and that said Letters Patent is hereby corrected as shown below:

COLUMN 20:
Line 3, "of" should read --a--; and
Line 23, "removing" should read --removed--.

Signed and Sealed this

Thirteenth Day of March, 2001

Attest:

NICHOLAS P. GODICI

Attesting Officer      Acting Director of the United States Patent and Trademark Office